(12) United States Patent
Lim et al.

(10) Patent No.: US 11,696,474 B2
(45) Date of Patent: Jul. 4, 2023

(54) DISPLAY DEVICE

(71) Applicant: Samsung Display Co., LTD., Yongin-Si (KR)

(72) Inventors: Sang Hyun Lim, Cheonan-si (KR); Dong Gyun Ra, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 144 days.

(21) Appl. No.: 16/916,821

(22) Filed: Jun. 30, 2020

(65) Prior Publication Data

US 2021/0066432 A1 Mar. 4, 2021

(30) Foreign Application Priority Data

Aug. 26, 2019 (KR) .................. 10-2019-0104703

(51) Int. Cl.
*H10K 59/131* (2023.01)
*H10K 50/844* (2023.01)

(52) U.S. Cl.
CPC ......... *H10K 59/131* (2023.02); *H10K 50/844* (2023.02)

(58) Field of Classification Search
CPC .................... H01L 27/3276; H01L 51/5253
See application file for complete search history.

(56) References Cited

U.S. PATENT DOCUMENTS

| | | | |
|---|---|---|---|
| 2007/0285903 A1 | 12/2007 | Tomari | |
| 2009/0205200 A1 | 8/2009 | Rosenblatt et al. | |
| 2016/0365398 A1* | 12/2016 | Kim | H01L 29/45 |
| 2017/0162126 A1* | 6/2017 | Lee | G09G 3/3291 |
| 2017/0352716 A1* | 12/2017 | Lee | H10K 77/10 |
| 2018/0164913 A1* | 6/2018 | Choi | G06F 3/041 |

FOREIGN PATENT DOCUMENTS

| | | |
|---|---|---|
| JP | 2007-317861 | 12/2007 |
| KR | 10-0715877 | 5/2007 |
| KR | 10-0943731 | 2/2010 |
| KR | 2019-0048460 | 5/2019 |

* cited by examiner

*Primary Examiner* — Vongsavanh Sengdara
(74) *Attorney, Agent, or Firm* — H.C. Park & Associates, PLC

(57) ABSTRACT

A display device includes, among other things, a pad area having a pattern that may reduce the distance gap between the signal lines cause by the contour changes of the signal lines. A corresponding print circuit board may also include a similar pattern to assimilate the distance gap between the lead wires. The pad and print circuit board may contact through anisotropic conductive film.

13 Claims, 24 Drawing Sheets

DISPLAY DEVICE

CROSS REFERENCE TO RELATED APPLICATION

This application claims priority from and the benefit of Korean Patent Application No. 10-2019-0104703, filed on Aug. 26, 2019, which is hereby incorporated by reference for all purposes as if fully set forth herein.

BACKGROUND

Field

Exemplary embodiments/implementations of the invention relate generally to a display device.

Discussion of the Background

A display device is a device for displaying data. The display device includes a display area and a non-display area. In the display area, a plurality of pixels are disposed on the substrate, and in the non-display rea, a plurality of pads are disposed on the substrate. A flexible film (e.g., a chip-on-film (COF)) with driving circuits mounted thereon may be coupled to the pads and may transmit driving signals to the pixels.

The flexible film may include a plurality of leads which are coupled to the pads, and the leads may be bonded to separate pads. The leads may be bonded to the pads via an anisotropic conductive film (ACF) disposed between the pads.

The above information disclosed in this Background section is only for understanding of the background of the inventive concepts, and, therefore, it may contain information that does not constitute prior art.

SUMMARY

Devices constructed/methods according to exemplary implementations/embodiments of the invention are capable of providing a display device that may reduce air bubbles in an anisotropic conductive film (ACF), which bonds a printed circuit film and a display panel, during the thermal compression of the ACF.

However, embodiments of the present disclosure are not restricted to those set forth herein. The above and other embodiments of the present disclosure will become more apparent to one of ordinary skill in the art to which the present disclosure pertains by referencing the detailed description of the present disclosure given below.

According to one or more exemplary implementations/embodiments of the invention, a display device includes: a base substrate; a plurality of signal wires disposed on the base substrate to extend in a first direction from an end portion of the base substrate and to be spaced apart from one another in a second direction which intersects the first direction; and insulating patterns disposed between the signal wires, on the end portion of the base substrate.

The base substrate may have, defined thereon, a display area and a pad area disposed on the periphery of the display area, the display device may further include an insulating layer which exposes the signal wires in the pad area, and the insulating layer may be disposed in the same layer as the insulating patterns.

The display device may further include a printed circuit board attached on the pad area, wherein the printed circuit board includes a driving integrated circuit (IC) and a plurality of lead wires which are connected to the driving IC and are spaced apart from one another in the second direction and the lead wires are disposed to overlap with the signal wires in a thickness direction.

The display device may further include an ACF disposed between the lead wires and the signal wires, wherein the lead wires and the signal wires are electrically connected by the ACF.

The insulating patterns may be disposed between the lead wires.

Each of the lead wires may include a first lead portion which has a first width and a second lead portion which has a second width that is smaller than the first width and is disposed between the first lead portion and the driving IC.

The insulating patterns may be disposed between the second lead portions of the lead wires.

A distance between the first lead portions of the lead wires may be smaller than a distance between the second lead portions of the lead wires.

The distance between the first lead portions of the lead wires may be 0.8 to 1.2 times the sum of the distance between the second lead portions of the lead wires and a distance between the insulating patterns.

The ACF may be in contact with sides of each of the first lead portions of the lead wires, sides of each of the second lead portions of the lead wires, and sides of each of the insulating patterns.

Each of the lead wires may further include a third lead portion which is disposed between the first and second lead portions, and a width of the third lead portion may gradually increase from the second lead portion to the first lead portion.

The insulating patterns may be further disposed between the third lead portions of the lead wires.

The distance between the first lead portions of the lead wires may be smaller than a distance between the third lead portions of the lead wires, and the distance between the first lead portions of the lead wires may be the same as the sum of the distance between the third lead portions of the lead wires and the distance between the third insulating patterns.

The ACF may be further in contact with sides of each of the third lead portions of the lead wires and the sides of each of the insulating patterns.

Each of the insulating patterns may include a plurality of patterns which are spaced apart from one another in the second direction.

According to yet another exemplary implementation/embodiment of the invention, a display device includes: a base substrate having, defined thereon, a display area and a pad area which is disposed on the periphery of the display area; a plurality of signal wires disposed on the base substrate to extend in a first direction from an end portion of the base substrate and to be spaced apart from one another in a second direction which intersects the first direction; a printed circuit board including a driving IC, a plurality of lead wires which are connected to the driving IC and are spaced apart from one another in the second direction, and an insulating layer which exposes the lead wires in the pad area; and an ACF disposed between the lead wires and the signal wires, wherein the lead wires are disposed to overlap with the signal wires in a thickness direction and the insulating layer includes protrusion patterns which protrude toward the signal wires.

Each of the lead wires may include a first lead portion which has a first width and a second lead portion which has a second width smaller than the first width and is disposed between the first lead portion and the driving IC, and the protrusion patterns may be disposed between the second lead portions of the lead wires.

A distance between the first lead portions of the lead wires may be smaller than a distance between the second lead portions of the lead wires, and the distance between the first lead portions of the lead wires may be 0.8 to 1.2 times the sum of the distance between the second lead portions of the lead wires and a distance between the insulating patterns.

The ACF may be in contact with sides of each of the first lead portions of the lead wires, sides of each of the second lead portions of the lead wires, and sides of each of the insulating patterns.

Each of the lead wires may further include a third lead portion which is disposed between the first and second lead portions, a width of the third lead portion may gradually increase from the second lead portion to the first lead portion, and the protrusion patterns may be further disposed between the third lead portions of the lead wires.

According to the aforementioned and other embodiments of the present disclosure, the generation of air bubbles in an ACF, which bonds a printed circuit film and a display panel, can be reduced during the thermal compression of the ACF.

Other features and embodiments may be apparent from the following detailed description, the drawings, and the claims.

Additional features of the inventive concepts will be set forth in the description which follows, and in part will be apparent from the description, or may be learned by practice of the inventive concepts.

It is to be understood that both the foregoing general description and the following detailed description are exemplary and explanatory and are intended to provide further explanation of the invention as claimed.

DETAILED DESCRIPTION

Figure 1:
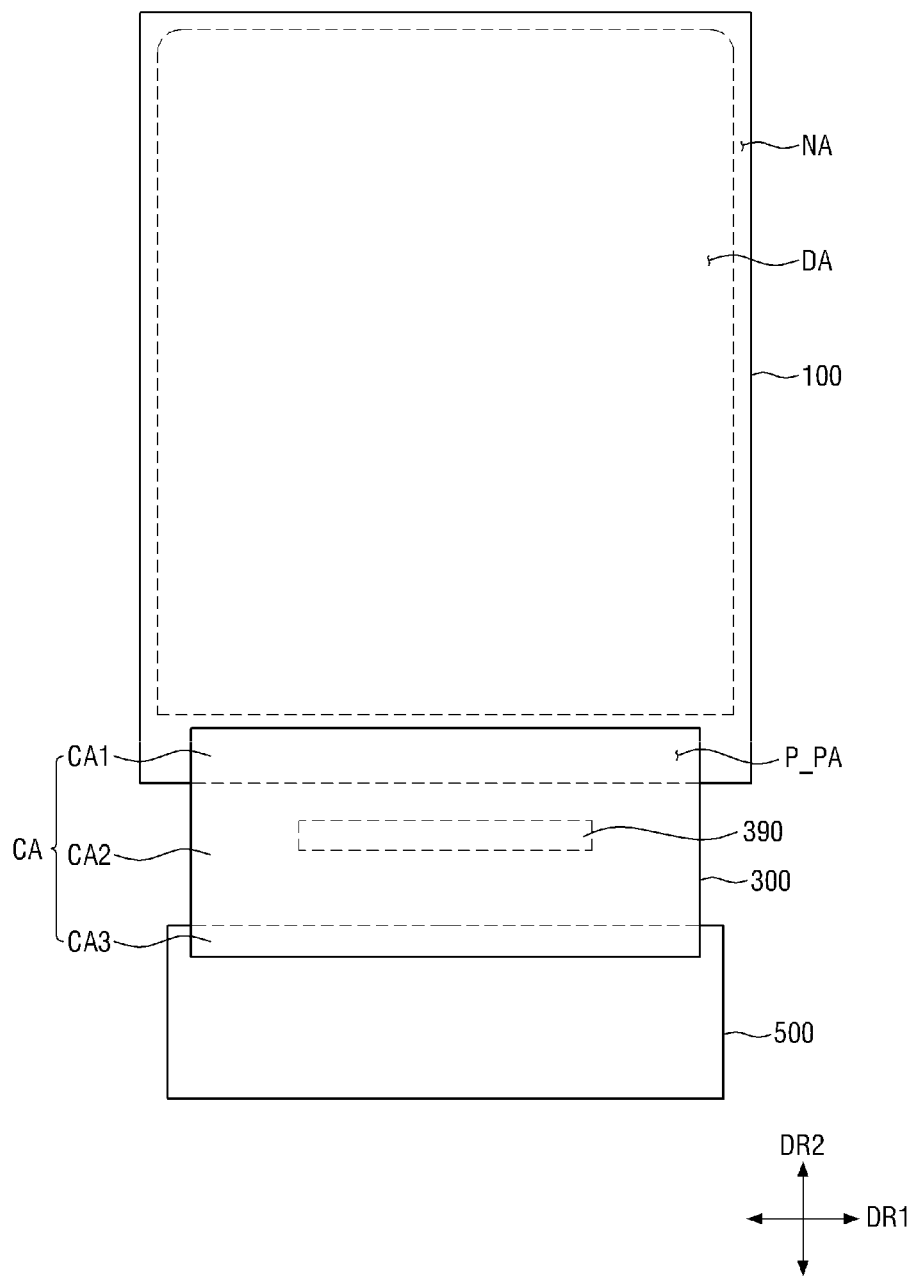
FIG. 1 is a plan/perspective view of a display device constructed according to an exemplary embodiment of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the attached drawings.

Figure 2:
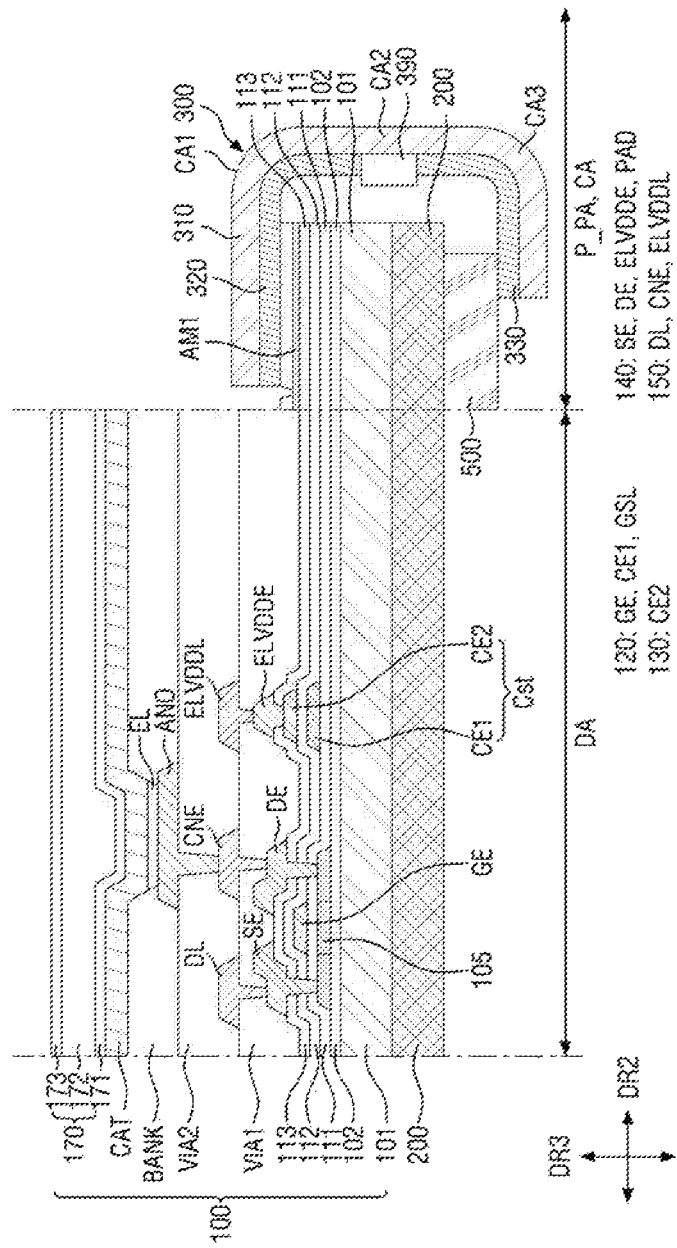
FIG. 2 is a cross-sectional view of the display device of FIG. 1.

FIG. 1 is a layout view of a display device according to an embodiment of the present disclosure, and FIG. 2 is a cross-sectional view of the display device of FIG. 1.

A display device 1, which is a device for displaying a moving image or a still image, may be used not only as the display screen of a mobile electronic device such as a mobile phone, a smartphone, a tablet personal computer (PC), a smartwatch, a watchphone, a mobile communication terminal, an electronic notepad, an electronic book (e-book) reader, a portable multimedia player (PMP), a navigation device, or an ultra-mobile PC (UMPC), but also as the display screen of various other products such as a television (TV), a notebook computer, a monitor, a billboard, or an Internet-of-Things (IoT) device.

Referring to FIGS. 1 and 2, the display device 1 may include a display panel 100 which displays an image, a printed circuit board (PCB) 300 which is connected to the display panel 100, and a main circuit board 500 which is connected to the PCB 300.

The display panel 100 may be, for example, an organic light-emitting diode (OLED) display panel. The display panel 100 will hereinafter be described as being, for example, an OLED display panel, but the present disclosure is not limited thereto. That is, various other display panels such as a liquid crystal display (LCD) panel, a quantum dot (QD)-OLED display panel, a QD-LCD panel, a quantum nano-light-emitting diode (nanoLED) display panel, or a micro light-emitting diode (microLED) display panel may be used as the display panel 100.

The display panel 100 includes a display area DA which includes a plurality of pixel regions and a non-display area NA which is disposed on the periphery of the display area DA. The display area DA may have a rectangular shape with right-angled or rounded corners in a plan view. The display area DA may have short sides and long sides. The short sides of the display area DA may extend in a first direction DR1. The long sides of the display area DA may extend in a second direction DR2. However, the planar shape of the display area DA is not particularly limited, and the display area DA may have various other shapes such as a circular shape or an elliptical shape in a plan view. The non-display area NA may be disposed adjacent to both short sides and both long sides of the display area DA. In this case, the non-display area NA may surround all the sides of the display area DA and may form the edges of the display area DA, but the present disclosure is not limited thereto. Alternatively, the non-display area NA may be disposed adjacent only to both short sides or both long sides of the display area DA.

The non-display area NA of the display panel 100 may include a panel pad area P_PA. The panel pad area P_PA may be disposed adjacent to, for example, one of the short sides of the display area DA, but the present disclosure is not limited thereto. Alternatively, the panel pad area P_PA may be disposed adjacent to both short sides of the display area DA or to both short sides and both long sides of the display area DA.

The PCB 300 may include a printed base film 310 and a driving integrated circuit (IC) 390 which is disposed on the printed base film 310. The printed base film 310 may include an insulating material.

The PCB 300 may include a first circuit area CA1 which is attached to the panel pad area P_PA of the display panel 100, a second circuit area CA2 which is disposed on one side, in the second direction DR2, of the first circuit area CA1, and a third circuit area CA3 which is disposed on one side, in the second direction DR2, of the second circuit area CA2 and is attached to the main circuit board 500. The driving IC 390 may be disposed on one surface of the second circuit area CA2 of the PCB 300. The driving IC 390 may be, for example, a data driving IC, and a chip-on-film (COF) implemented as a data driving IC may be applied to the driving IC 390.

The main circuit board 500 may include a circuit pad area which is attached to the third circuit area CA3 of the PCB 300. In the circuit pad area of the main circuit board 500, a plurality of circuit pads may be disposed and may be connected to lead wires in the third circuit area CA3 of the PCB 300.

Referring to FIG. 2, the display device 1 may further include a panel bottom sheet 200 which is disposed below the display panel 100. The panel bottom sheet 200 may be attached to the bottom surface of the display panel 100. The panel bottom sheet 200 may include one or more functional layers. The functional layers may be layers that perform a heat dissipation function, an electromagnetic shielding function, a grounding function, a buffer function, a strength reinforcement function, a support function, and/or a digitizing function. The functional layers may be sheet layers, film layers, thin-film layers, coating layers, panels, or plates. The functional layers may have a single-layer structure or may each have a stack of multiple thin films or coating layers. The functional layers may be, for example, support substrates, heat dissipation layers, electromagnetic shielding layers, impact absorbing layers, or digitizers.

The PCB 300 may be bent downwardly in a third direction DR3, as illustrated in FIG. 2. One side of the PCB 300 and the main circuit board 500 may be located below the panel bottom sheet 200. The bottom surface of the panel bottom sheet 200 may be coupled to the main circuit board 500 via an adhesive layer, but the present disclosure is not limited thereto.

The display panel 100 may include a display substrate 101, a plurality of conductive layers, a plurality of insulating layers which insulate the conductive layers, and an organic layer EL.

The display substrate 101 may be disposed in and across the display area DA and the non-display area NA. The display substrate 101 may support various elements disposed thereon. For example, the display substrate 101 may be a rigid substrate including a rigid material such as flexible glass or quartz, but the present disclosure is not limited thereto. In another example, the display substrate 101 may be a flexible substrate including a flexible material such as polyimide (PI).

A buffer layer 102 may be disposed on the display substrate 101. The buffer layer 102 may prevent the penetration of moisture and oxygen through the display substrate 101. The buffer layer 102 may include one of a silicon nitride (SiNx) film, a silicon oxide ($SiO_2$) film, and a silicon oxynitride (SiOxNy) film.

A semiconductor layer 105 may be disposed on the buffer layer 102. The semiconductor layer 105 may form the channel of a thin-film transistor (TFT). The semiconductor layer 105 may be disposed in each pixel in the display area DA and may also be disposed in the non-display area NA. The semiconductor layer 105 may include a source/drain region and an active region. The semiconductor layer 105 may include polycrystalline silicon.

A first insulating layer 111 may be disposed on the semiconductor layer 105. The first insulating layer 111 may be disposed on the entire surface of the display substrate 101. The first insulating layer 111 may be a gate insulating film having a gate insulation function. The first insulating layer 111 may include a silicon compound or metal oxide. For example, the first insulating layer 111 may include silicon oxide, silicon nitride, silicon oxynitride, aluminum oxide, tantalum oxide, hafnium oxide, zirconium oxide, or titanium oxide, and these materials may be used alone or in combination with one another.

A first conductive layer 120 may be disposed on the first insulating layer 111. The first conductive layer 120 may include a gate electrode GE of the TFT and a first electrode CE1 of a storage capacitor Cst. Although not specifically illustrated, the first conductive layer 120 may further include a gate signal wire. The gate signal wire may be disposed to pass through the display area DA and the panel pad area P_PA. The gate signal wire may be connected to a signal wire PAD of a third conductive layer 140. The first conductive layer 120 may include at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first conductive layer 120 may be a single-layer film or a stack of multiple films.

A second insulating layer 112 may be disposed on the first conductive layer 120. The second insulating layer 112 may insulate the first conductive layer 120 and a second conductive layer 130. The second insulating layer 112 may include one selected from among the aforementioned examples of the material of the first insulating layer 111. In the panel pad area P_PA, the second insulating layer 112 may include a plurality of contact holes which partially expose the top surface of the gate signal wire. The signal wire PAD and the gate signal wire may be electrically connected through the contact holes.

The second conductive layer 130 may be disposed on the second insulating layer 112. The second conductive layer 130 may include a second electrode CE2 of the storage capacitor Cst. The second conductive material 130 may include one selected from among the aforementioned examples of the material of the first insulating layer 111. The first and second electrodes CE1 and CE2 of the storage capacitor Cst may form the storage capacitor Cst via the second insulating layer 112.

A third insulating layer 113 may be disposed on the second conductive layer 130. The third insulating layer 113 may include at least one selected from among the aforementioned examples of the material of the first insulating layer 111. In some embodiments, the third insulating layer 113 may include an organic insulating material. The organic insulating material may be selected from among examples of the material of a first via layer VIA1.

A third conductive layer 140 may be disposed on the third insulating layer 113. The third conductive layer 140 may include a source electrode SE, a drain electrode DE, a high-potential voltage electrode ELVDDE, and the signal wire PAD. The third conductive layer 140 may include at least one metal selected from among Mo, Al, Pt, Pd, Ag, Mg, Au, Ni, Nd, Ir, Cr, Ca, Ti, Ta, W, and Cu. The third conductive layer 140 may be a single-layer film, but the present disclosure is not limited thereto. Alternatively, the third conductive layer 140 may be a stack of multiple films. For example, the third conductive layer 140 may have a stack of Ti/Al/Ti, Mo/Al/Mo, Mo/AlGe/Mo, or Ti/Cu. For example, the third conductive layer 140 may include Ti/Al/Ti.

The signal wire PAD of the third conductive layer 140 may be disposed to overlap with the gate signal wire of the first conductive layer 120 in a thickness direction and may be electrically coupled to the gate signal wire of the first conductive layer 120 through the contact holes of the second insulating layer 112.

A plurality of signal wires PAD may be provided. The plurality of signal wires PAD may be disposed to be spaced apart from one another in one direction. The plurality of signal wires PAD may be disposed to extend to the end of the panel pad area P_PA. The plurality of signal wires PAD may be connected to the gate signal wire and may thus be connected to the display area DA.

The first via layer VIA1 or a fourth insulating layer may be disposed on the third conductive layer 140. The first via layer VIA1 or the fourth insulating layer may include an organic insulating material or an inorganic insulating material. The organic insulating material may include at least one of an acrylic resin, an epoxy resin, a phenolic resin, a polyamide resin, a polyimide resin, an unsaturated polyester resin, a polyphenylene resin, a polyphenylene sulfide resin, or benzocyclobutene (BCB). The inorganic insulating material may include at least one of the aforementioned examples of the material of the first insulating layer 111.

As illustrated in FIG. 2, in the panel pad area P_PA, the first via layer VIA1 may expose the top surface of the signal wire PAD. Part of the top surface of the signal wire PAD exposed by the first via layer VIA1 may be electrically connected to the PCB 300 via a first adhesive member AM1.

The PCB 300 may further include a lead wire 320 which is disposed on one surface of the first circuit area CA1 of the printed base film 310 and a circuit lead wire 330 which is disposed on one surface of the third circuit area CA3 of the printed base film 310. The lead wire 320 may be electrically connected to the signal wire PAD. For example, the lead wire 320 may be electrically connected to the exposed part of the top surface of the signal wire PAD via the first adhesive member AM1. The first adhesive member AM1 may be an anisotropic conductive film (ACF). The ACF may include a resin layer and conductive balls which are dispersed in the resin layer.

The lead wire 320 and the circuit lead wire 330 may include a metallic material. The lead wire 320 and the circuit lead wire 330 may include at least one metal selected from among Mo, Al, Pt, Pd, Ag, Mg, Au, Ni, Nd, Ir, Cr, Ca, Ti, Ta, W, and Cu. For example, the lead wire 320 may include Cu and Au.

A fourth conductive layer 150 may be disposed on the first via layer VIA1. The fourth conductive layer 150 may include a data line DL, a connecting electrode CNE, and a high-potential voltage wire ELVDDL. The data line DL may be electrically coupled to the source electrode SE of the TFT via a contact hole that penetrates the first via layer VIA1. The connecting electrode CNE may be electrically coupled to the drain electrode DE of the TFT via another contact hole that penetrates the first via layer VIA1. The high-potential voltage wire ELVDDL may be electrically connected to the high-potential voltage electrode ELVDDE of the TFT via another contact hole that penetrates the first via layer VIA1. The fourth conductive layer 150 may include one selected from among the aforementioned examples of the material of the third conductive layer 140.

A second via layer VIA2 may be disposed on the fourth conductive layer 150. The second via layer VIA2 may include at least one selected from among the aforementioned examples of the material of the first via layer VIA1.

An anode electrode ANO may be disposed on the second via layer VIA2. The anode electrode ANO may be electrically connected to the connecting electrode CNE via a contact hole that penetrates the second via layer VIA2.

A bank layer BANK may be disposed on the anode electrode ANO. The bank layer BANK may include a contact hole which exposes the anode electrode ANO. The bank layer BANK may be formed of an organic insulating material or an inorganic insulating material. For example, the bank layer BANK may include at least one of photoresist, a polyimide resin, an acrylic resin, a silicon compound, and a polyacrylic resin.

The organic layer EL may be disposed on the top surface of the anode electrode ANO and in an opening of the bank layer BANK. A cathode electrode CAT is disposed on the organic layer EL and on the bank layer BANK. The cathode electrode CAT may be a common electrode disposed in common for all pixels.

A thin-film encapsulation layer 170 is disposed on the cathode electrode CAT. The thin-film encapsulation layer 170 may cover an OLED. The thin-film encapsulation layer 170 may be a layer in which an inorganic film and an organic film are alternately stacked. For example, the thin-film encapsulation layer 170 may include a first inorganic encapsulation film 171, an organic encapsulation film 172, and a second inorganic encapsulation film 173 which are sequentially stacked.

Figure 3:
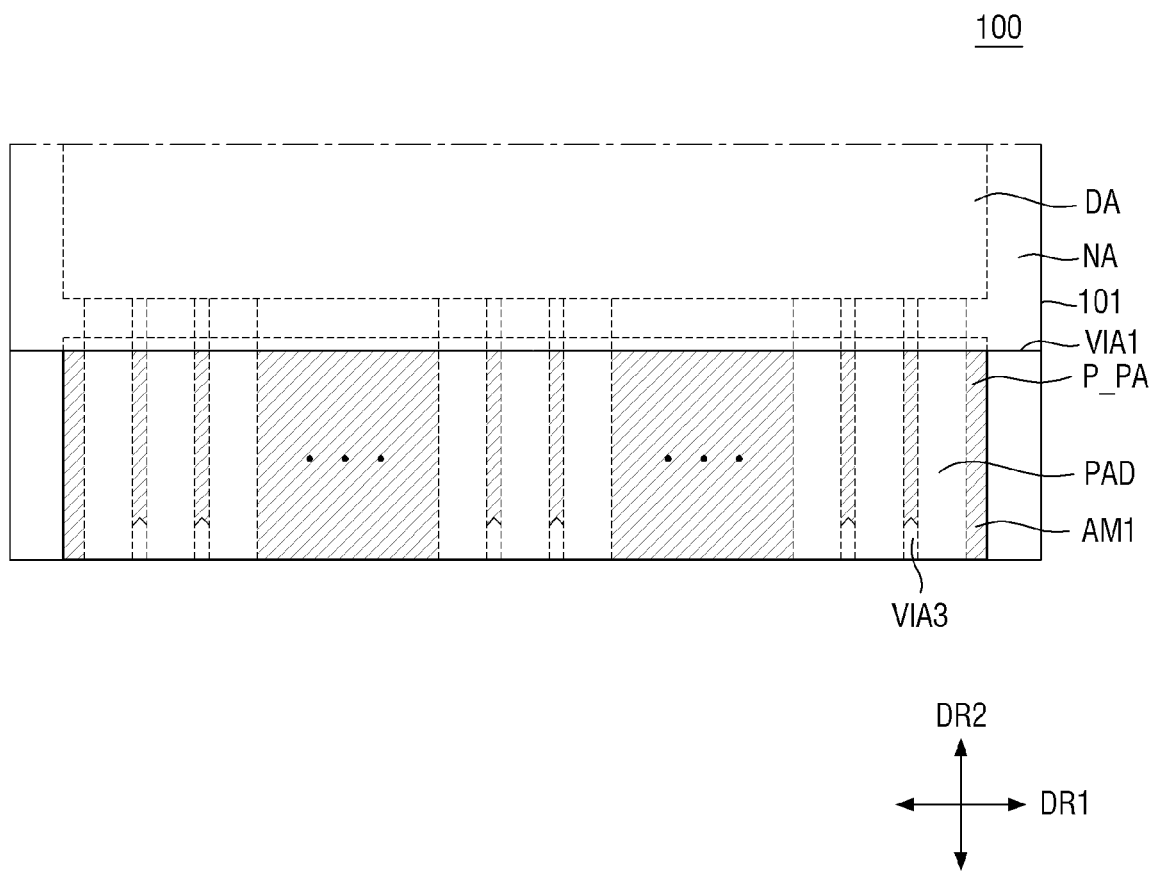
FIG. 3 is a partial layout view illustrating a pad area of the display device of FIG.
Figure 4:
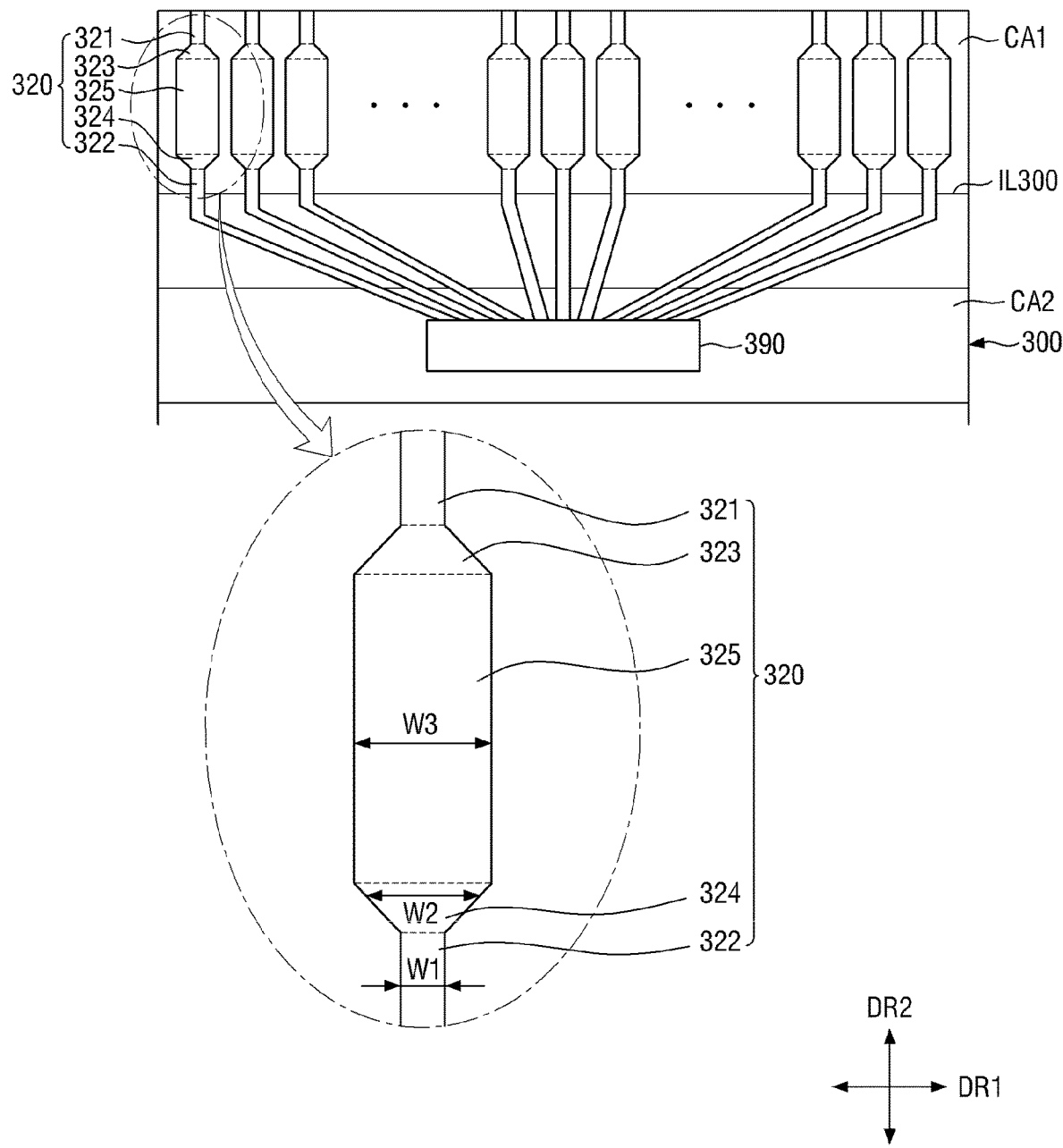
FIG. 4 is a partial layout view illustrating a printed circuit board (PCB) of the display device of FIG. 1.
Figure 5:
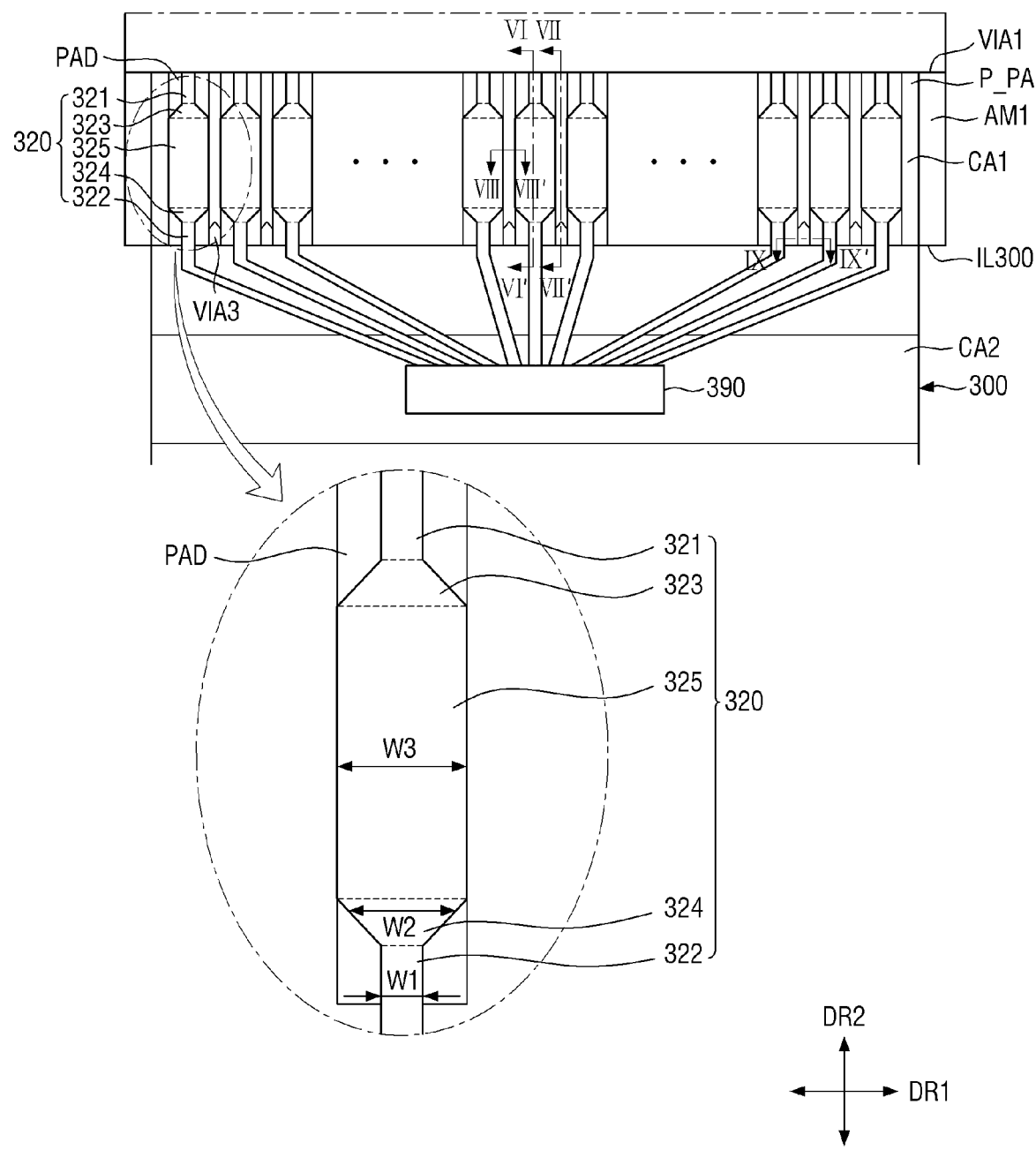
FIG. 5 is a layout view illustrating the pad area and the PCB of the display device of FIG. 1.
Figure 6:
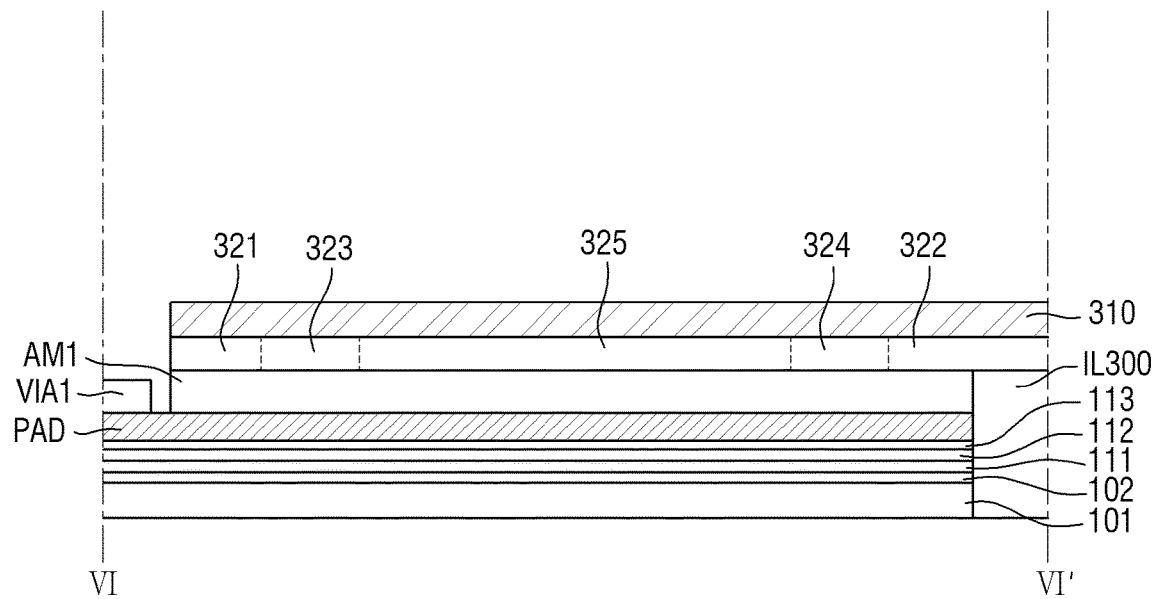
FIG. 6 is a cross-sectional view taken along line VI-VI' of FIG. 5.
Figure 7:
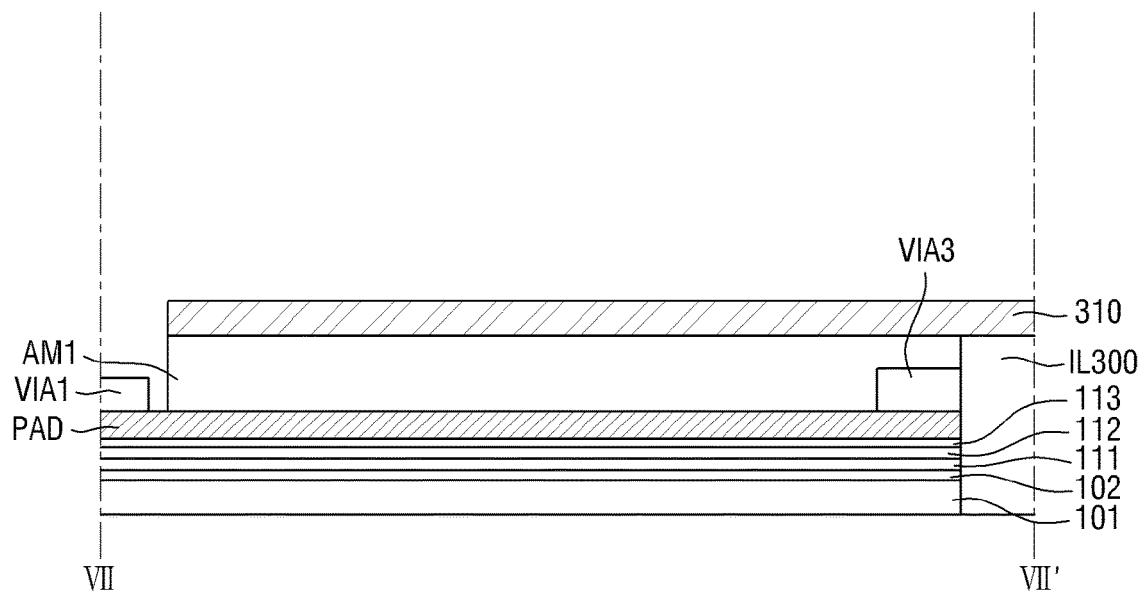
FIG. 7 is a cross-sectional view taken along line VII-VII' of FIG. 5.
Figure 8:
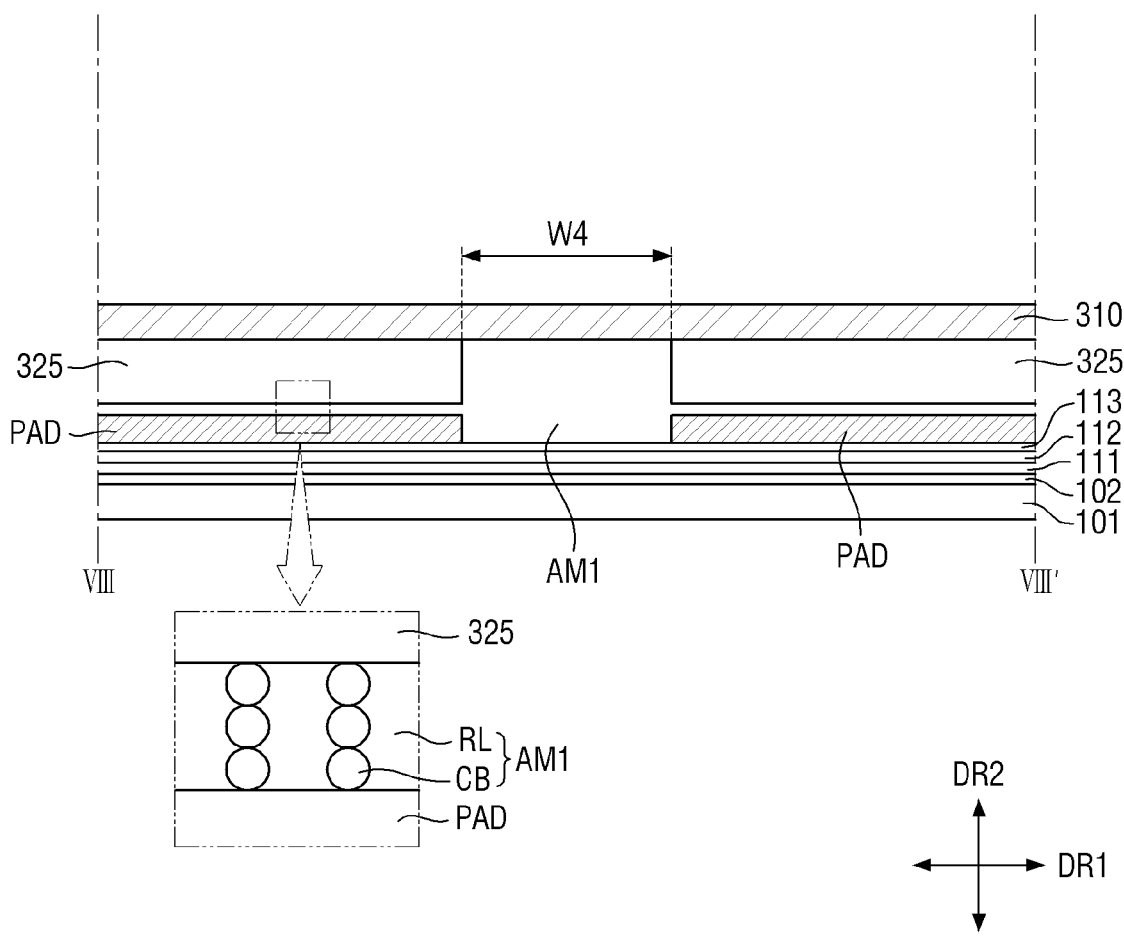
FIG. 8 is a cross-sectional view taken along line VIII-VIII' of FIG. 5.
Figure 9:
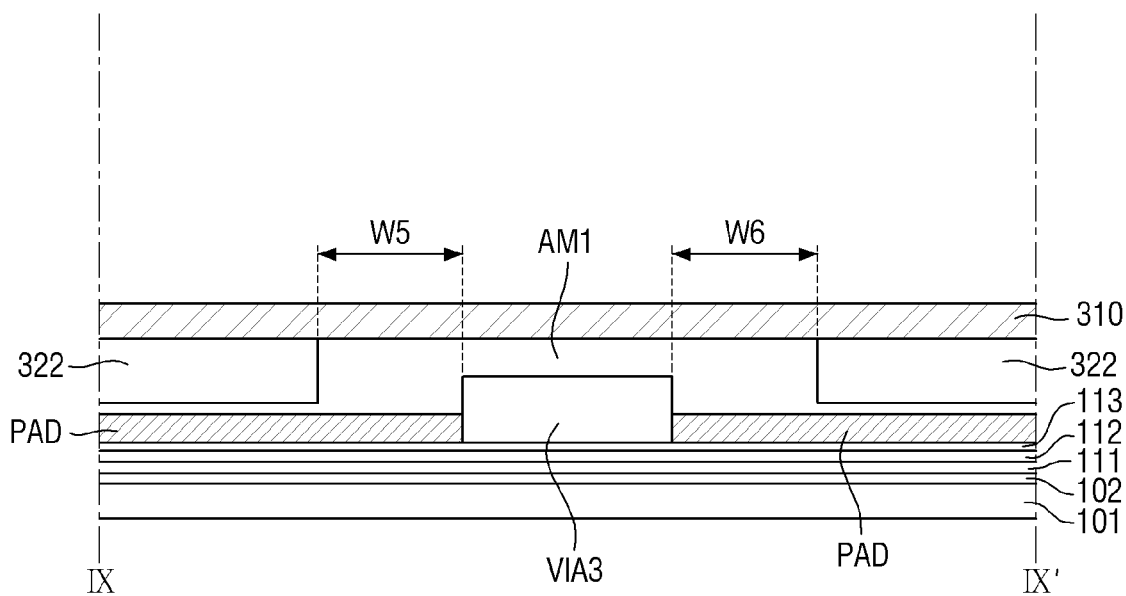
FIG. 9 is a cross-sectional view taken along line IX-IX' of FIG. 5.

FIG. 3 is a partial layout view illustrating the pad area of the display device of FIG. 1, FIG. 4 is a partial layout view illustrating the printed circuit board of the display device of FIG. 1, FIG. 5 is a layout view illustrating the pad area and the PCB of the display device of FIG. 1, FIG. 6 is a cross-sectional view taken along line VI-VI' of FIG. 5, FIG. 7 is a cross-sectional view taken along line VII-VII' of FIG. 5, FIG. 8 is a cross-sectional view taken along line VIII-VIII' of FIG. 5, and FIG. 9 is a cross-sectional view taken along line IX-IX' of FIG. 5.

Referring to FIG. 3, a plurality of signal wires PAD may be provided and may be disposed along the first direction DR1. The plurality of signal wires PAD may include, for example, a power pad, a data pad, and a panel dummy pad. The first direction DR1 may be a direction from the panel pad area P_PA to the display area DA. The second direction DR2 may be a direction intersecting the first direction DR1. FIG. 3 illustrates that the plurality of signal wires PAD have a uniform width and extend to the panel pad area P_PA, but the present disclosure is not limited thereto.

The first adhesive member AM1 may be disposed on the panel pad area P_PA. The first adhesive member AM1 may be disposed on the plurality of signal wires PAD.

The display panel 100 of the display device 1 may further include insulating patterns VIA3 which are disposed at an end, in the first direction DR1, of the base substrate 101 along one of the short sides of the base substrate 101. The insulating patterns VIA3 may be disposed in the same layer as the first via layer VIA1 or the fourth insulating layer. The insulating patterns VIA3 may include the same material as the first via layer VIA1 or the fourth insulating layer. The insulating patterns VIA3 may be formed by the same process as the first via layer VIA1.

The insulating patterns VIA3 may be disposed between the plurality of signal wires PAD. The insulating patterns VIA3 are illustrated in FIG. 3 as not overlapping with the plurality of signal wires PAD, but may slightly overlap with the plurality of signal wires PAD in the thickness direction.

The insulating patterns VIA3 may be in contact with pairs of sides of the plurality of signal wires PAD, but the present disclosure is not limited thereto. Alternatively, the insulating patterns VIA3 may be disposed to be a predetermined distance apart from the pairs of sides of the plurality of signal wires PAD.

The insulating patterns VIA3 may be disposed on an end portion of the base substrate 101 to be aligned in the thickness direction. That is, in a plan view, the insulating patterns VIA3 may protrude from the end of the base substrate 101 to the display area DA.

The insulating patterns VIA3 may have a pentagonal shape in a plan view, as illustrated in FIG. 3. That is, first sides of the insulating patterns VIA3 may be aligned with the end of the base substrate 101 in the thickness direction, second sides and third sides of the insulating patterns VIA3 that are connected to the first sides of the insulating patterns VIA3 may face the pairs of sides of the plurality of signal wires PAD, and fourth sides and fifth sides of the insulating patterns VIA3 that are connected to the second sides and the third sides, respectively, of the insulating patterns VIA3 may extend in directions between the first and second directions DR1 and DR2. The fourth sides and the fifth sides of the insulating patterns VIA3 may form corners that protrude toward the display area DA.

In a plan view, the insulating patterns VIA3 and the plurality of signal wires PAD may be covered, in the panel pad area P_PA, by the first adhesive member AM1.

Referring to FIG. 4, a plurality of lead wires 320 may be provided. The plurality of lead wires 320 of the PCB 300 may be electrically connected to the driving IC 390. The plurality of lead wires 320 may be disposed to be spaced apart from one another in the first direction DR1. Each of the plurality of lead wires 320 may include portions that have different widths in the first direction DR1. Each of the plurality of lead wires 320 may include a first lead portion 321 which is disposed adjacent to the end of the first circuit area CA1, a second lead portion 322 which is connected to the driving IC 390, a third lead portion 323 which is disposed between the first lead portion 321 and a fifth lead portion 325, a fourth lead portion 324 which is disposed between the second and fifth lead portions 322 and 325, and the fifth lead portion 325 which is disposed between the third and fourth lead portions 323 and 324.

The second lead portion 322 may have a first width W1, the fourth lead portion 324 may have a second width W2, and the fifth lead portion 325 may have a third width W3. The first, second, and third widths W1, W2, and W3 may be widths as measured in the first direction DR1. The first and third widths W1 and W3 may be uniform, and the second width W2 may range between the first and third widths W1 and W3 and may gradually increase from the second lead portion 322 to the fifth lead portion 325.

FIG. 4 illustrates that the sides of the fourth lead portion 324 may be rectilinear in a plan view, but the present disclosure is not limited thereto. That is, the sides of the fourth lead portion 324 may have a predetermined slope so that the second width W2 may gradually decrease from the second lead portion 322 to the fifth lead portion 325.

The first and third lead portions 321 and 323 may be symmetrical with the second and fourth lead portions 322 and 324 with respect to the fifth lead portion 325.

Referring to FIG. 5, the plurality of lead wires 320 may be disposed on the plurality of signal wires PAD, respectively. Each of the plurality of signal wires PAD may be disposed over multiple portions of a corresponding lead wire 320. Each of the plurality of signal wires PAD may be disposed to overlap with the first through fifth lead portions 321 through 325 of the corresponding lead wire 320 in the thickness direction.

As illustrated in FIG. 5, each of the insulating patterns VIA3 of the display panel 100 may be disposed between the second and fourth lead portions 322 and 324 of one lead wire 320 and the second and fourth lead portions 322 and 324 of another (neighboring) lead wire 320. That is, the insulating patterns VIA3 may be disposed to overlap with the second lead portions 322 and the fourth lead portions 324 of the lead wires 320 in the first direction DR1.

The second sides and the third sides of the insulating patterns VIA3 may extend in the same direction as, and face, the second lead portions 322 of the lead wires 320, the fourth sides of the insulating patterns VIA3 may extend in the same direction as, and face, the left sides of the fourth lead portions 324 of the lead wires 320, and the fifth sides of the insulating patterns VIA3 may extend in the same direction as, and face, the right sides of the fourth lead portions 324 of the lead wires 320.

Referring to FIG. 6, the PCB 300 may further include an insulating layer IL300 which is disposed on the printed base film 310 and expose the surface of a lead wire 320 in the panel pad area P_PA or in the first circuit area CA1. The insulating layer IL300 may include an insulating material having flexibility. For example, the insulating layer IL300 may include a flexible film that includes solder resist or PI.

Part of the surface of the lead wire 320 exposed by the insulating layer IL300 may be electrically connected to a signal wire PAD. One side of the first adhesive member AM1 may be disposed to be a predetermined distance apart from the first via layer VIA1, and the other side of the first adhesive member AM1 may be aligned with the end of the base substrate 101 in the thickness direction.

The first adhesive member AM1 may be disposed between the lead wire 320 and the signal wire PAD. The first adhesive member AM1 may be interposed between the lead wire 320 and the signal wire PAD to electrically couple the lead wire 320 and the signal wire PAD. The first adhesive member AM1 may be disposed to overlap with first through fifth lead portions 321 through 325 of the lead wire 320 and may be in contact with the first through fifth lead portions 321 through 325 of the lead wire 320.

Referring to FIG. 7, an insulating pattern VIA3 may be disposed on the surface of the third insulating layer 113, at the end of the base substrate 101. The first adhesive member AM1 may be disposed on, and in contact with, a side and the top surface of the insulating pattern VIA3. The first adhesive member AM1 may be disposed to overlap with the overlapping pattern VIA3. The overlapping part of the first adhesive member AM1 with the overlapping pattern VIA3 may be thinner than the non-overlapping part of the first adhesive member AM1 with the insulating pattern VIA3.

Referring to FIG. 8, fifth lead portions 325 of a pair of adjacent lead wires 320 which are spaced apart from each other in the first direction DR1 may be disposed to be a fourth width W4 apart from each other. A pair of adjacent signal wires PAD which are spaced apart from each other in the first direction DR1 may also be disposed to be the fourth width W4 apart from each other, but the present disclosure is not limited thereto. Alternatively, the pair of adjacent signal wires PAD may be spaced apart from each other by a distance smaller than, or greater than, the fourth width W4.

The first adhesive member AM1 may be in contact with sides of the fifth lead portions 325 of the pair of adjacent lead wires 320 and with sides of the pair of adjacent signal wires PAD.

The first adhesive member AM1 may be disposed to overlap with the fifth lead portions 325 of the pair of adjacent lead wires 320 and the pair of adjacent signal wires PAD. The portions of the first adhesive member AM1 that overlap with the fifth lead portions 325 of the pair of adjacent lead wires 320 and the pair of adjacent signal wires PAD may be thinner than the portions of the first adhesive member AM1 that do not overlap with the fifth lead portions 325 of the pair of adjacent lead wires 320 and the pair of adjacent signal wires PAD.

The first adhesive member AM1 may include a resin layer RL and a plurality of conductive balls CB which are dispersed in the resin layer RL. The read wire 320 and the signal wire PAD may be electrically coupled via the conductive balls CB.

Referring to FIG. 9, second lead portions 322 of a pair of adjacent lead wires 320 which are spaced apart from each other in the first direction DR1 may be disposed to be spaced apart from each other by a distance greater than the fourth width W4. Also, fourth lead portions of the pair of adjacent lead wires 320 may be disposed to be spaced apart from each other by a distance greater than the fourth width, but smaller than the distance between the second lead portions 322 of the pair of adjacent lead wires 320.

The height of an insulating pattern VIA3 from the third insulating layer 113 in the thickness direction may be greater than the height of a pair of adjacent signal wires PAD from the third insulating layer 113 in the thickness direction. That is, the surface of the insulating pattern VIA3 may be higher than the surfaces of the pair of adjacent signal wires PAD. Sides of the insulating pattern VIA3 may be in direct contact with the pair of adjacent signal wires PAD, but the present disclosure is not limited thereto.

The insulating pattern VIA3 may have a first side adjacent to the left second lead portion 322 and a second side adjacent to the right second lead portion 322. The first side of the insulating pattern VIA3 and the left second lead portion 322 may be a fifth width W5 apart from each other, and the second side of the insulating pattern VIA3 and the right second lead portion 322 may be a sixth width W6 apart from each other.

The sum of the fifth and sixth widths W5 and W6 may be substantially the same as the fourth width W4. For example, the sum of the fifth and sixth widths W5 and W6 may be about 0.8 to about 1.2 times the fourth width W4.

Referring again to FIG. 5, in a plan view, the sum of the distance between the left sides of the fourth portions 324 of the lead wires 320 and the insulating patterns VIA3 and the distance between the right sides of the fourth portions 324 of the lead wires 320 and the insulating patterns VIA3 may be substantially the same as the fourth width W4. For example, in a plan view, the sum of the distance between the left sides of the fourth portions 324 of the lead wires 320 and the insulating patterns VIA3 and the distance between the right sides of the fourth portions 324 of the lead wires 320 and the insulating patterns VIA3 may be about 0.8 to about 1.2 times the fourth width W4.

Referring again to FIG. 9, the first adhesive member AM1 may be in direct contact with the top surfaces of the pair of adjacent signal wires PAD, surfaces of the second lead portions 322 of the pair of adjacent lead wires 320 that face the signal wires PAD, sides of the second lead portions 322 of the pair of adjacent lead wires 320, portions of sides of the insulating pattern VIA3 exposed by the pair of adjacent signal wires PAD, and the top surface of the insulating pattern VIA3.

Figure 10:
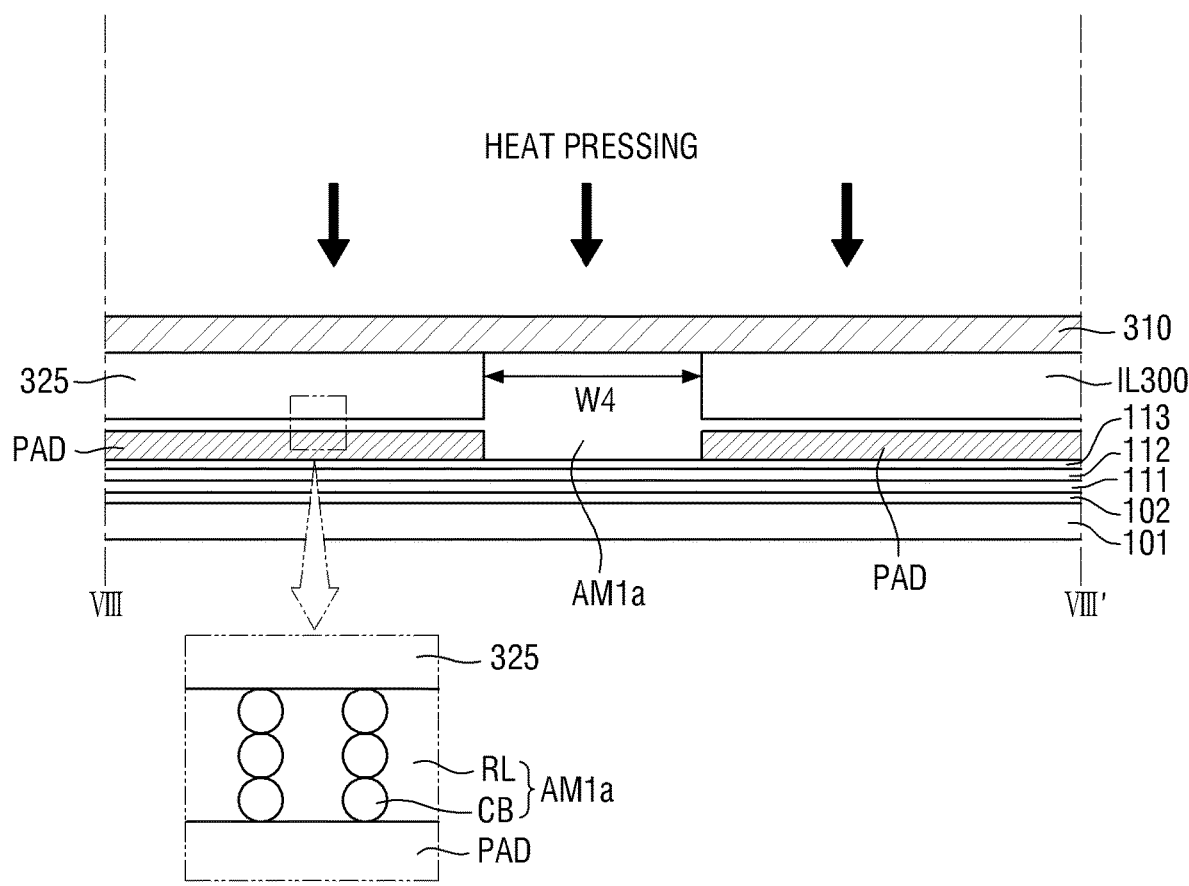
FIG. 10 is a cross-sectional view illustrating a process of bonding a display panel and the PCB of the display device of FIG. 1.
Figure 11:
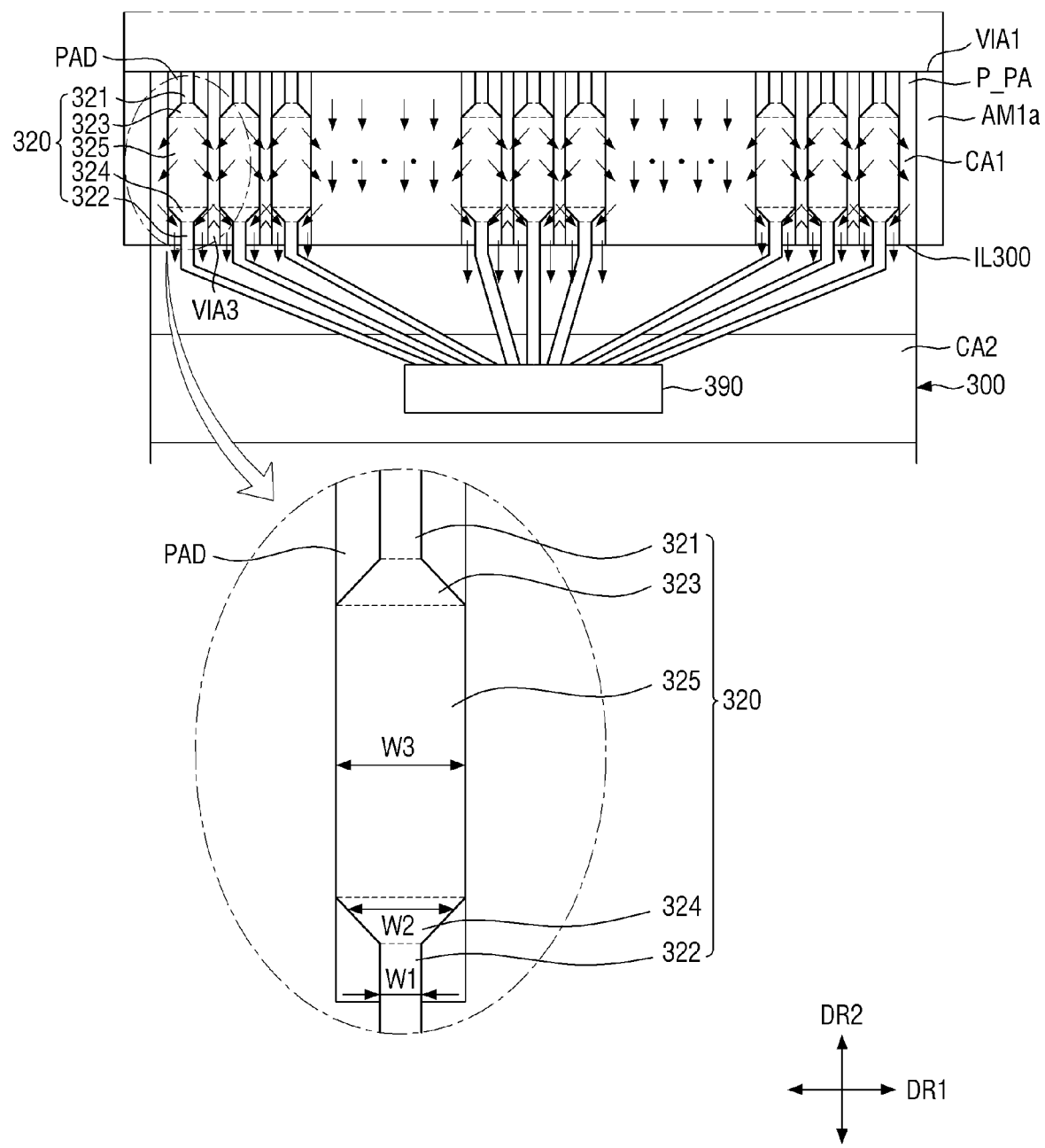
FIG. 11 is a plan view illustrating how a first adhesive member flows in the process illustrated in FIG. 10.

FIG. 10 is a cross-sectional view illustrating a process of bonding the display panel and the PCB of the display device of FIG. 1, and FIG. 11 is a plan view illustrating how the first adhesive member flows in the process illustrated in FIG. 10.

Referring to FIGS. 10 and 11, a bonding apparatus (not illustrated) is placed on the PCB 300. The bonding apparatus may bond lead wires 320 and signal pads PAD via a first adhesive member material AM1a by pressing the top surface of the PCB 300. The bonding apparatus may partially melt the first adhesive member material AM1a by providing heat. Due to the influence of downward pressure, the partially-melted first adhesive member material may fill the spaces between the lead wires 320 and between the signal pads PAD, as illustrated in FIG. 11.

FIG. 11 illustrates downward flows of the first adhesive member material AM1a in the second direction DR2 when the first adhesive member material AM1a is partially melted and fills the spaces between the lead wires 320 and between the signal pads PAD under the influence of the downward pressure.

The flow speed of the first adhesive member material AM1a is associated with the area of a space in which the first adhesive member material AM1a can flow. As already mentioned above, fifth lead portions 325 of the lead wires 320, which are spaced apart from one another in the first direction DR1, may be spaced apart from one another by the fourth width W4, second lead portions 322 of the lead wires 320 may be spaced apart from one another by a distance greater than the fourth width W4, and fourth lead portions 324 of the lead wires 320 may also be spaced apart from one another by a distance greater than the fourth width W4.

Thus, when the first adhesive member material AM1a is partially melted and flows downwardly in the second direction DR2, the flow speed of the first adhesive member material AM1a may decrease because the distance, in the first direction DR1, between the lead wires 320 increases from the fifth lead portions 325 to the fourth lead portions 324 to the second lead portions 322. Accordingly, air bubbles generated in the first adhesive member material AM1a may not be properly pushed away to the end of the display panel 100, but may remain around the fourth lead portions 324 and the second lead portions 322. The remaining air bubbles may induce moisture concentration, causing bonding defects around the fourth lead portions 324 and the second lead portions 322.

The first sides of insulating patterns VIA3 and second lead portions 322 on the left of the insulating patterns VIA3 may be spaced apart by the fifth width W5, the second sides of the insulating patterns VIA3 and second lead portions 322 on the right of the insulating patterns VIA3 may be spaced apart by the sixth width W6, and the sum of the fifth and sixth widths W5 and W6 may be substantially the same as the fourth width W4. Also, the sum of the distance between the left sides of the fourth portions 324 of the lead wires 320 and the insulating patterns VIA3 and the distance between the right sides of the fourth portions 324 of the lead wires 320 and the insulating patterns VIA3 may be substantially the same as the fourth width W4.

Accordingly, when the first adhesive member material AM1a is partially melted and flows downwardly in the second direction DR2 due to the influence of the downward pressure, any decrease in the flow speed of the first adhesive member material AM1a can be prevented even if the distance between the lead wires 320 increases from the fifth lead portions 325 to the fourth lead portions 324 to the second lead portions 322. That is, the exemplary embodiment may prevent the air bubbles generated in the first adhesive member material AM1a from remaining around the fourth lead portions 324 and the second lead portions 322, and as a result, may prevent in advance the penetration of external moisture or the occurrence of bonding defects due to air bubbles.

Display devices according to other embodiments of the present disclosure will hereinafter be described, focusing mainly on differences with the display device of FIG. 1.

Figure 12:
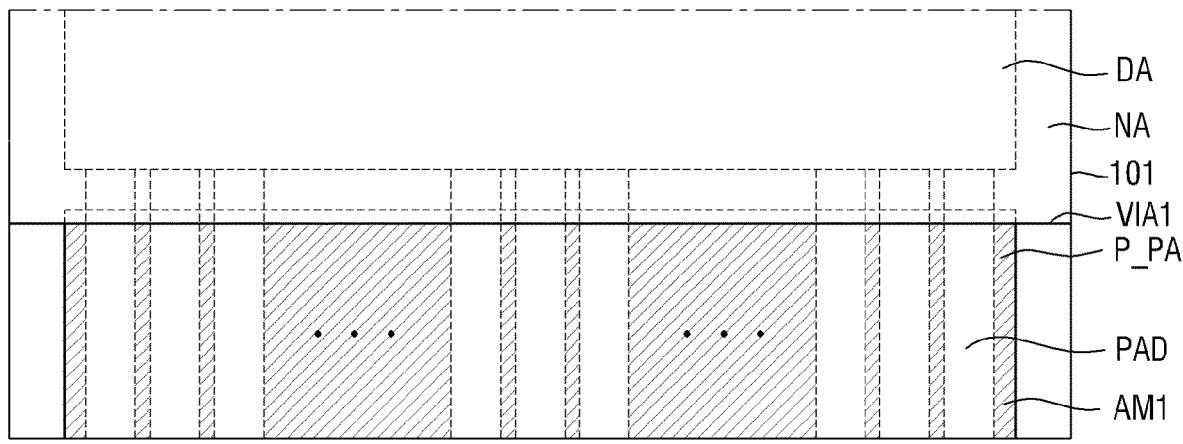
FIG. 12 is a partial layout view illustrating a pad area of a display device according to another embodiment of the present disclosure.
Figure 12:
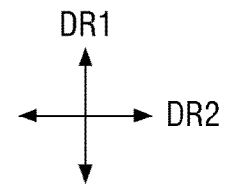
Figure 13:
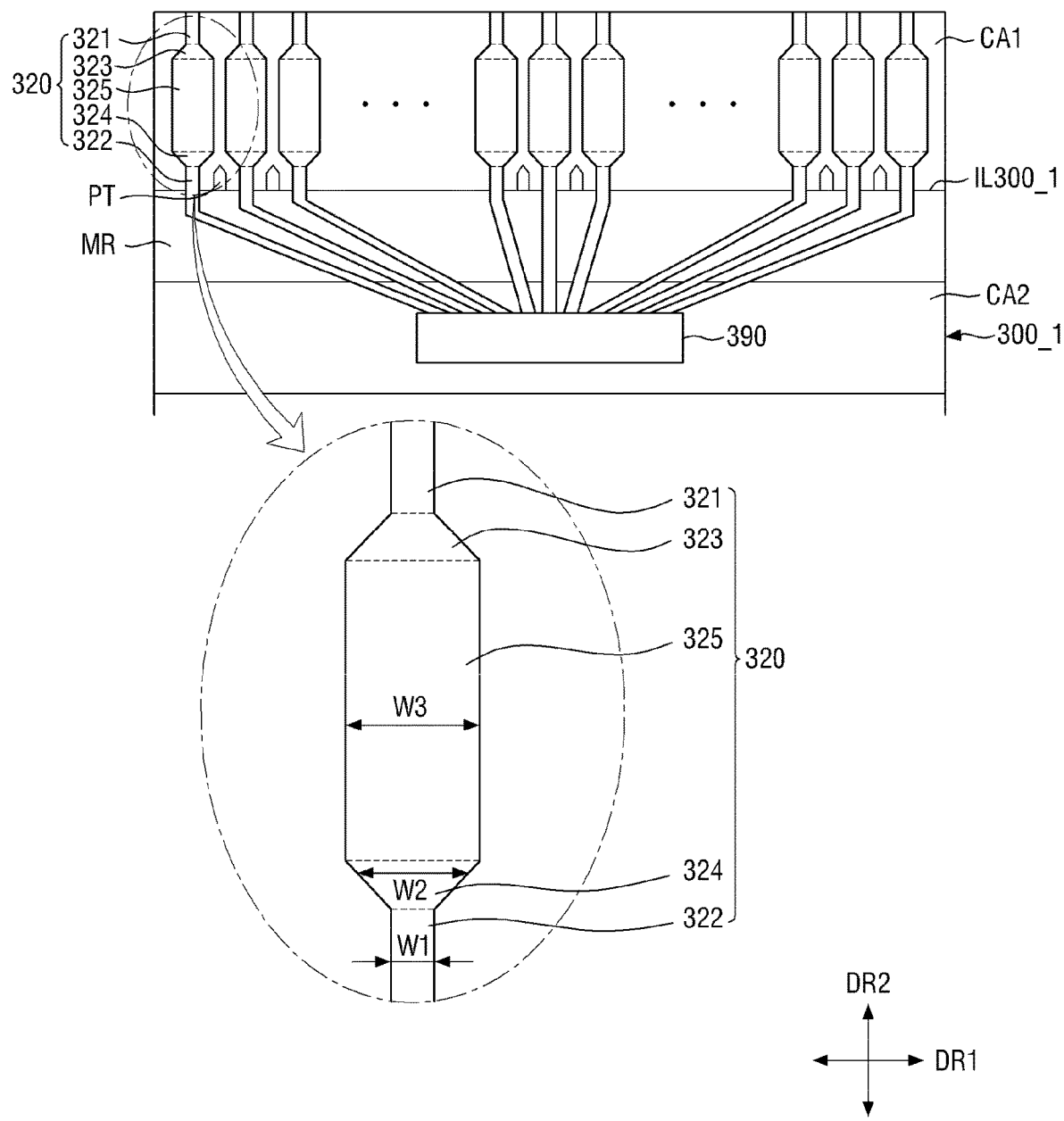
FIG. 13 is a partial layout view illustrating a PCB of the display device of FIG. 12.
Figure 14:
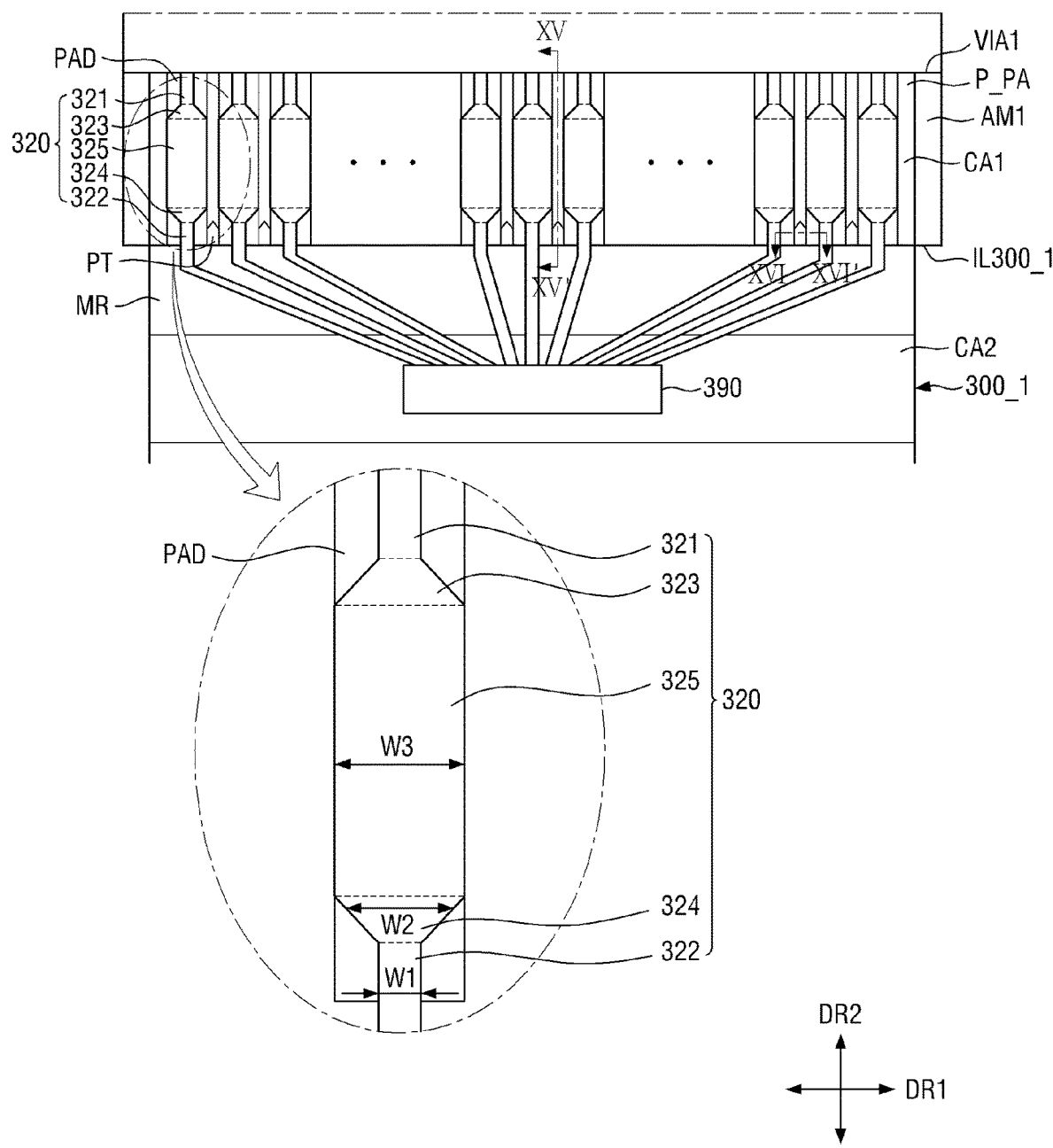
FIG. 14 is a layout view illustrating the pad area and the PCB of the display device of FIG. 12.
Figure 15:
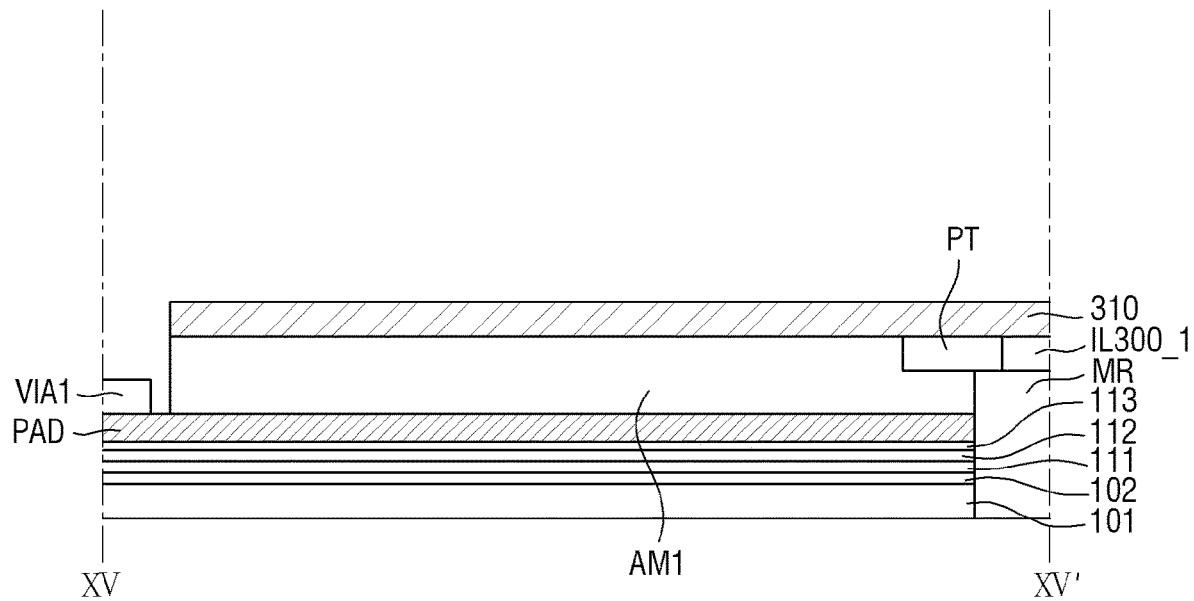
FIG. 15 is a cross-sectional view taken along line XV-XV' of FIG. 14.
Figure 16:
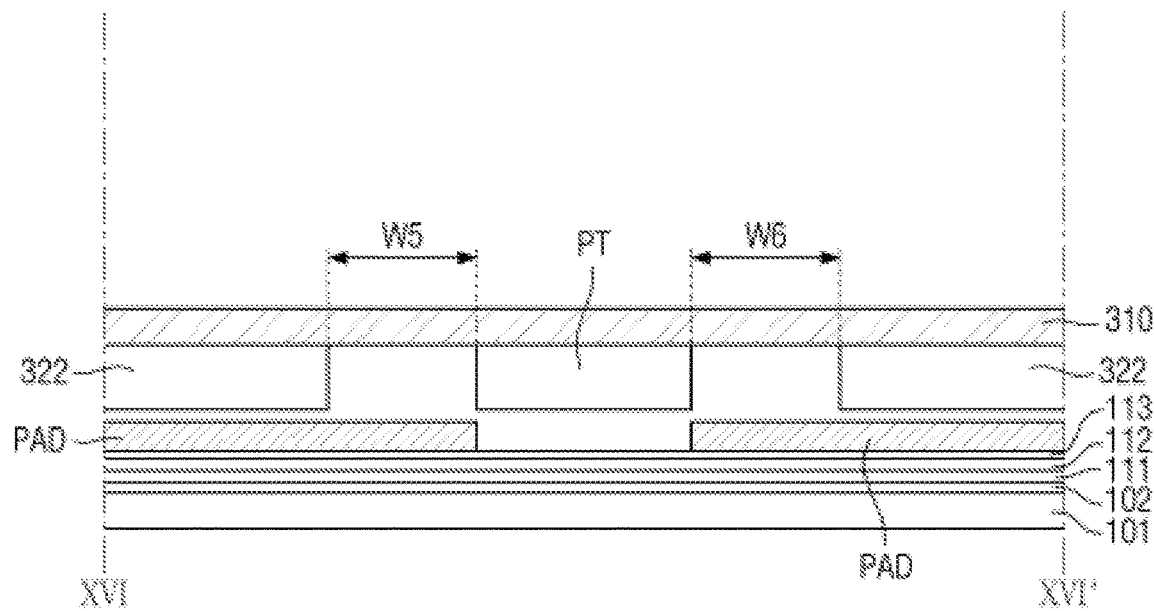
FIG. 16 is a cross-sectional view taken along line XVI-XVI' of FIG. 14.

FIG. 12 is a partial layout view illustrating a pad area of a display device according to another embodiment of the present disclosure, FIG. 13 is a partial layout view illustrating a PCB of the display device of FIG. 12, FIG. 14 is a layout view illustrating the pad area and the PCB of the display device of FIG. 12, FIG. 15 is a cross-sectional view taken along line XV-XV' of FIG. 14, and FIG. 16 is a cross-sectional view taken along line XVI-XVI' of FIG. 14.

The display device according to the embodiment of FIGS. 12 through 16 differs from the display device of FIG. 1 in that a display panel 100_1 does not include insulating patterns, and that a PCB 300_1 includes protrusion patterns PT.

Specifically, no insulating patterns may be provided in the display panel 100_1, and the protrusion patterns PT may be provided in the PCB 300_1.

Referring to FIGS. 13 and 14, an insulating layer IL300_1 of a PCB 300_1 may include the protrusion patterns PT, which protrude from the end of a main portion MR. A plurality of protrusion patterns PT may be provided.

The protrusion patterns PT may include the same material as the insulating layer IL300_1. In a plan view, the protrusion patterns PT may be disposed between a plurality of signal wires PAD which are adjacent to one another. The protrusion patterns PT are illustrated as not overlapping with the signal wires PAD, but may slightly overlap with the signal wires PAD in a thickness direction.

The protrusion patterns PT may be disposed on an end portion of a base substrate 101 to be aligned in the thickness direction. That is, in a plan view, the protrusion patterns PT may protrude from the end of the base substrate 101 to a display area DA.

The protrusion patterns PT may have substantially the same shape as the insulating patterns VIA3 of FIG. 3. That is, the protrusion patterns PT may have a pentagonal shape in a plan view. In other words, first sides of the protrusion patterns PT may be aligned with the end of the base substrate 101 in the thickness direction, second sides and third sides of the protrusion patterns PT that are connected to the first sides of the protrusion patterns PT may face the pairs of sides of the signal wires PAD, and fourth sides and fifth sides of the protrusion patterns PT that are connected to the second sides and the third sides, respectively, of the protrusion patterns PT may extend in directions between first and second directions DR1 and DR2. The fourth sides and the fifth sides of the protrusion patterns PT may form corners that protrude toward the display area DA.

In a plan view, the protrusion patterns PT and the signal wires PAD may be covered by a first adhesive member AM1 in a panel pad area P_PA.

Referring to FIG. 15, a protrusion pattern PT may be disposed on a printed base film 310 and may be physically connected to the main portion MR of the insulating layer IL300_1. The first adhesive member AM1 may be disposed on, and in contact with, a side and the top surface of the protrusion pattern PT. The first adhesive member AM1 may be disposed to overlap with the protrusion pattern PT. The part of the first adhesive member AM1 overlapping with the protrusion pattern PT may be thinner than the part of the first adhesive member AM1 that does not overlap with the protrusion pattern PT.

Referring to FIG. 16, second lead portions 322 of a pair of adjacent lead wires 320 which are spaced apart from each other in the first direction DR1 may be disposed to be spaced apart from each other by a distance greater than a fourth width W4. Also, fourth lead portions of the pair of adjacent lead wires 320 may be disposed to be spaced apart from each other by a distance greater than the fourth width, but smaller than the distance between the second lead portions 322 of the pair of adjacent lead wires 320.

The height of a protrusion pattern PT from the printed base film 310 in the thickness direction may be greater than the height of the second lead portions 322 of the pair of adjacent lead wires 320 from the protrusion pattern PT in the thickness direction. That is, the surface of the protrusion pattern PT may be higher than the surfaces of the second lead portions 322 of the pair of adjacent lead wires 320.

The protrusion pattern PT may have a first side adjacent to the left second lead portion 322 and a second side adjacent to the right second lead portion 322. The first side of the protrusion pattern PT and the left second lead portion 322 may be a fifth width W5 apart from each other, and the second side of the protrusion pattern PT and the right second lead portion 322 may be a sixth width W6 apart from each other.

The sum of the fifth and sixth widths W5 and W6 may be substantially the same as the fourth width W4. For example, the sum of the fifth and sixth widths W5 and W6 may be about 0.8 to about 1.2 times the fourth width W4.

Also, referring again to FIG. 14, in a plan view, the sum of the distance between the left sides of the fourth portions 324 of the lead wires 320 and the protrusion patterns PT and the distance between the right sides of the fourth portions 324 of the lead wires 320 and the protrusion patterns PT may be substantially the same as the fourth width W4. For example, in a plan view, the sum of the distance between the left sides of the fourth portions 324 of the lead wires 320 and the protrusion patterns PT and the distance between the right sides of fourth portions 324 of the lead wires 320 and the protrusion patterns PT may be about 0.8 to about 1.2 times the fourth width W4.

The first sides of the protrusion patterns PT and second lead portions 322 on the left of the protrusion patterns PT may be spaced apart by the fifth width W5, the second sides of the protrusion patterns PT and second lead portions 322 on the right of the protrusion patterns PT may be spaced apart by the sixth width W6, and the sum of the fifth and sixth widths W5 and W6 may be substantially the same as the fourth width W4. Also, the sum of the distance between the left sides of the fourth portions 324 of the lead wires 320 and the protrusion patterns PT and the distance between the right sides of the fourth portions 324 of the lead wires 320 and the protrusion patterns PT may be substantially the same as the fourth width W4.

Accordingly, when the first adhesive member material AM1 is partially melted and flows downwardly in the second direction DR2 due to the influence of downward pressure, any decrease in the flow speed of the first adhesive member material AM1 can be prevented even if the distance between the lead wires 320 increases from the fifth lead portions 325 to the fourth lead portions 324 to the second lead portions 322. That is, air bubbles generated in the first adhesive member material AM1 can be prevented from remaining around the fourth lead portions 324 and the second lead portions 322, and as a result, the penetration of external moisture or the occurrence of bonding defects due to air bubbles can be prevented in advance.

Figure 17:
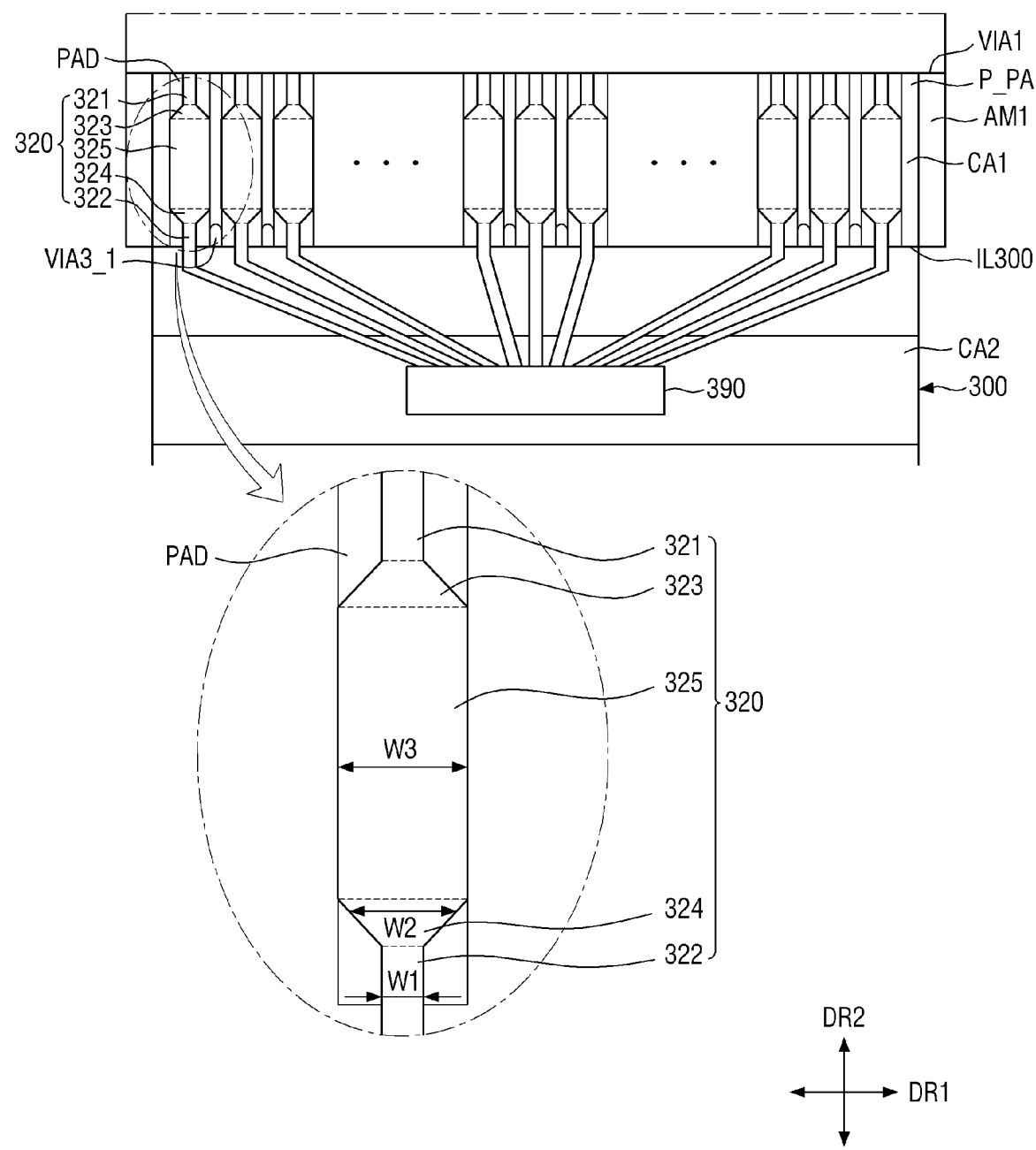
FIG. 17 is a layout view illustrating a pad area and a PCB of a display device according to another embodiment of the present disclosure.

FIG. 17 is a layout view illustrating a pad area and a PCB of a display device according to another embodiment of the present disclosure.

The display device of FIG. 17 differs from the display device of FIG. 1 in that insulating patterns VIA3_1 may have curved sides.

Specifically, the fourth sides and the fifth sides of the insulating patterns VIA3 of FIG. 3 may be curved, as illustrated in FIG. 17.

Figure 18:
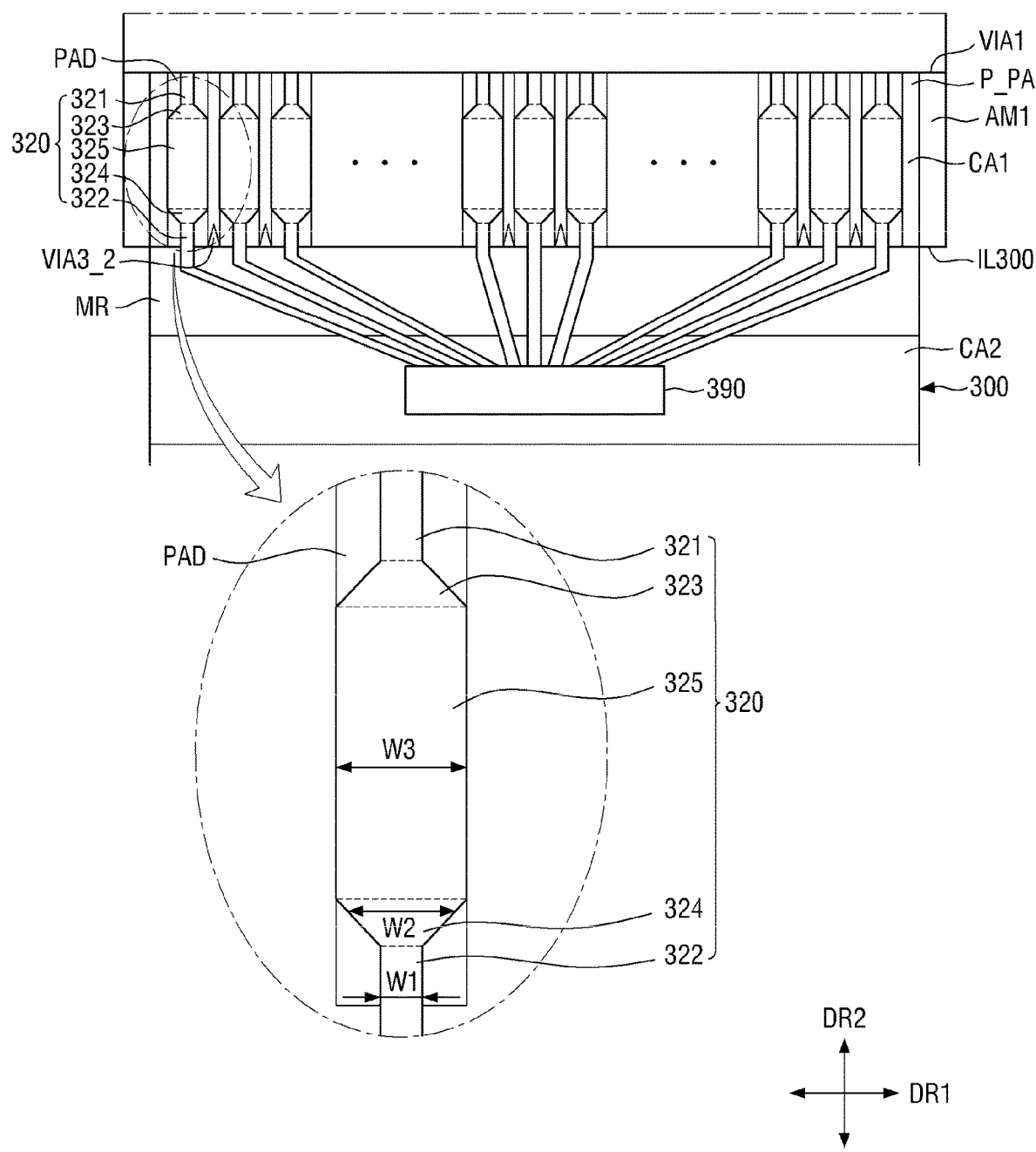
FIG. 18 is a layout view illustrating a pad area and a PCB of a display device according to another embodiment of the present disclosure.

FIG. 18 is a layout view illustrating a pad area and a PCB of a display device according to another embodiment of the present disclosure.

The display device of FIG. 18 differs from the display device of FIG. 1 in that insulating patterns VIA3_2 may have a triangular shape in a plan view.

Specifically, the second sides and the fourth sides of the insulating patterns VIA3 of FIG. 3 form sixth sides together, and the third sides and the fifth sides of the insulating patterns VIA3 of FIG. 3 form seventh sides. Accordingly, the first sides, the sixth sides, and the seventh sides of the insulating patterns VIA3 may form triangular shapes.

Figure 19:
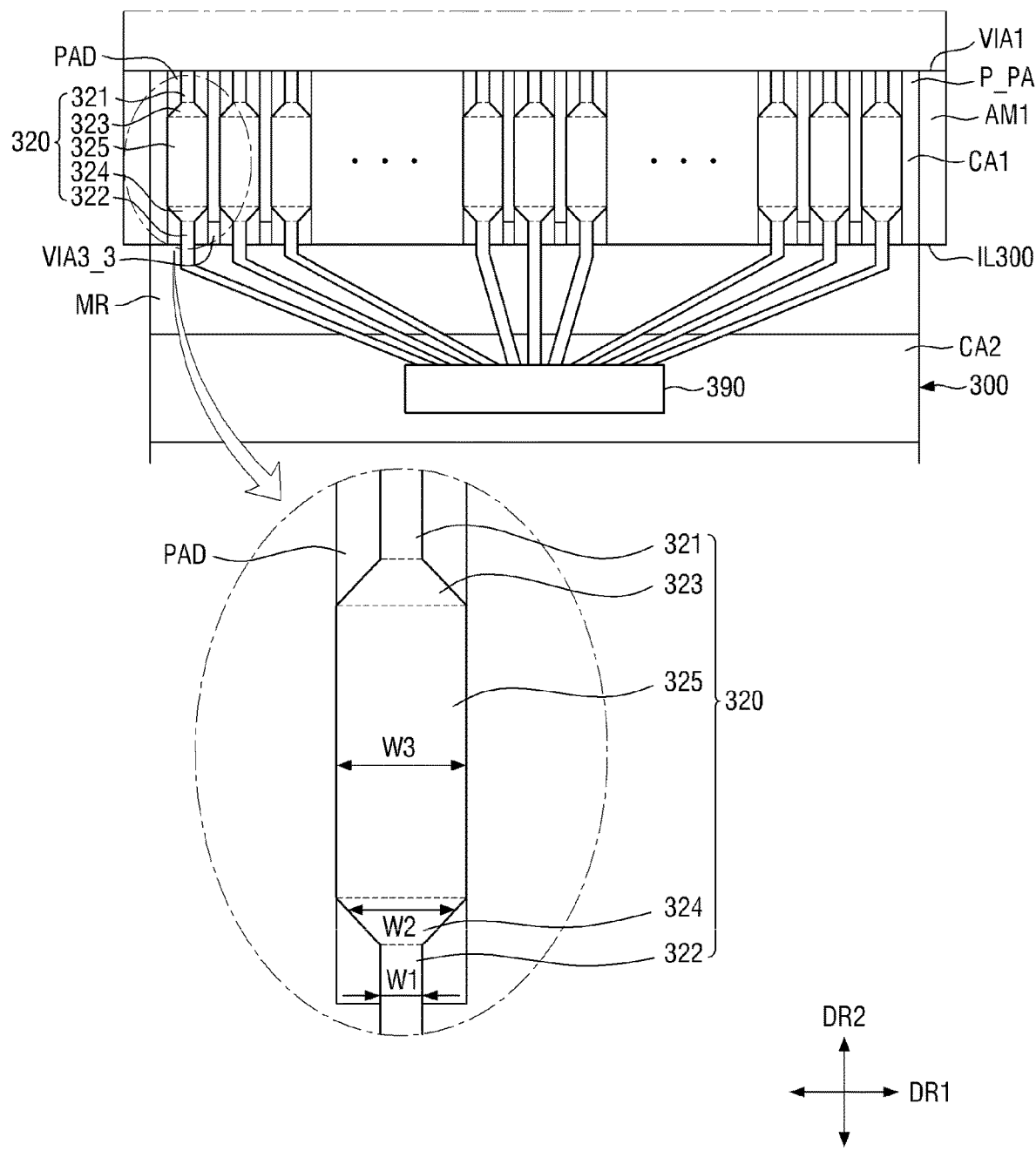
FIG. 19 is a layout view illustrating a pad area and a PCB of a display device according to another embodiment of the present disclosure.

FIG. 19 is a layout view illustrating a pad area and a PCB of a display device according to another embodiment of the present disclosure.

The display device of FIG. 19 differs from the display device of FIG. 1 only in that insulating patterns VIA3_3 have a rectangular shape in a plan view, and thus, a detailed description thereof will be omitted.

Figure 20:
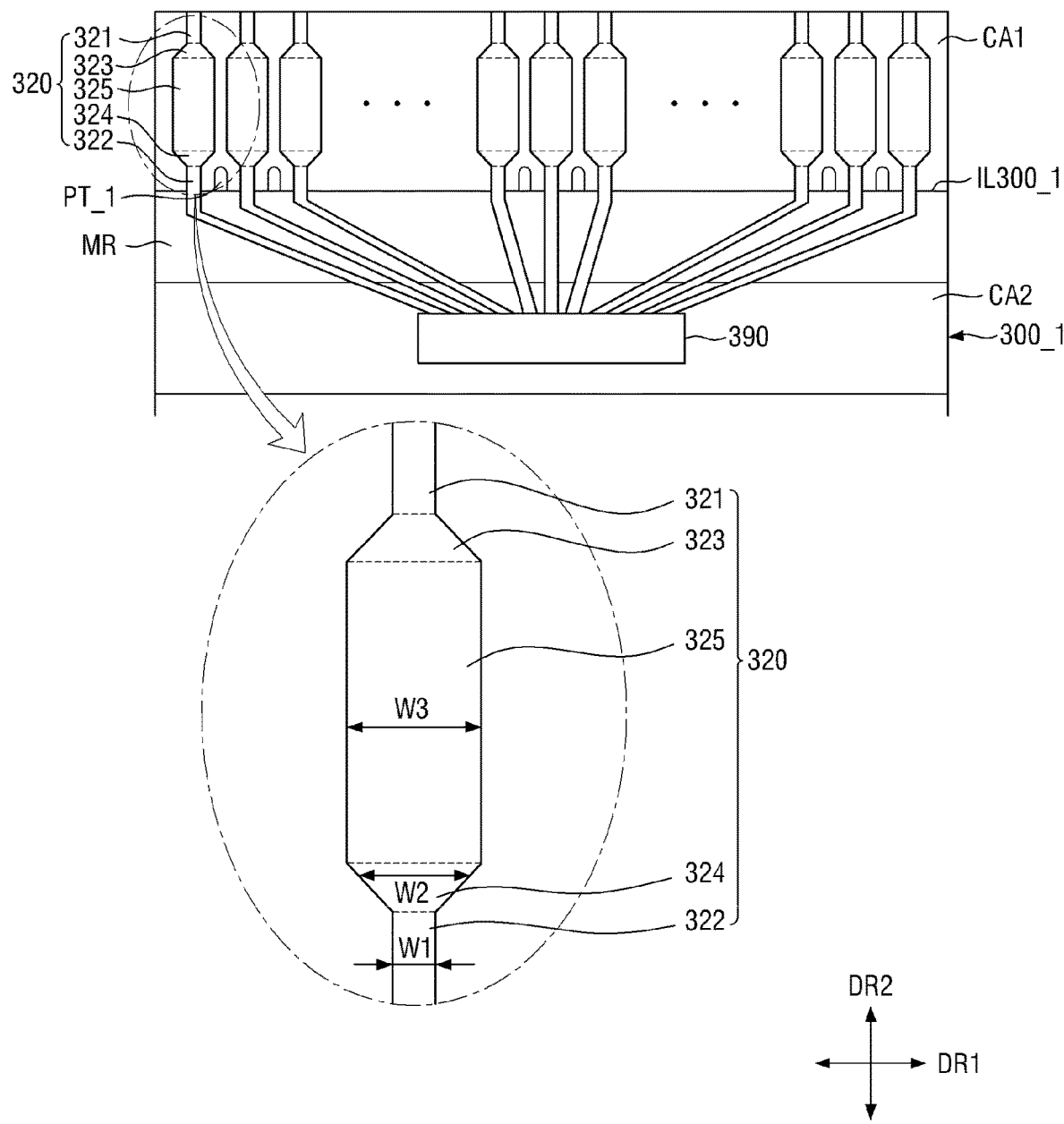
FIG. 20 is a partial layout view illustrating a PCB of a display device according to another embodiment of the present disclosure.

FIG. 20 is a partial layout view illustrating a PCB of a display device according to another embodiment of the present disclosure.

The display device of FIG. 20 differs from the display device of FIG. 13 only in that protrusion patterns PT_1, like the insulating patterns VIA3_1 of FIG. 17, may have curved sides, and thus, a detailed description thereof will be omitted.

Figure 21:
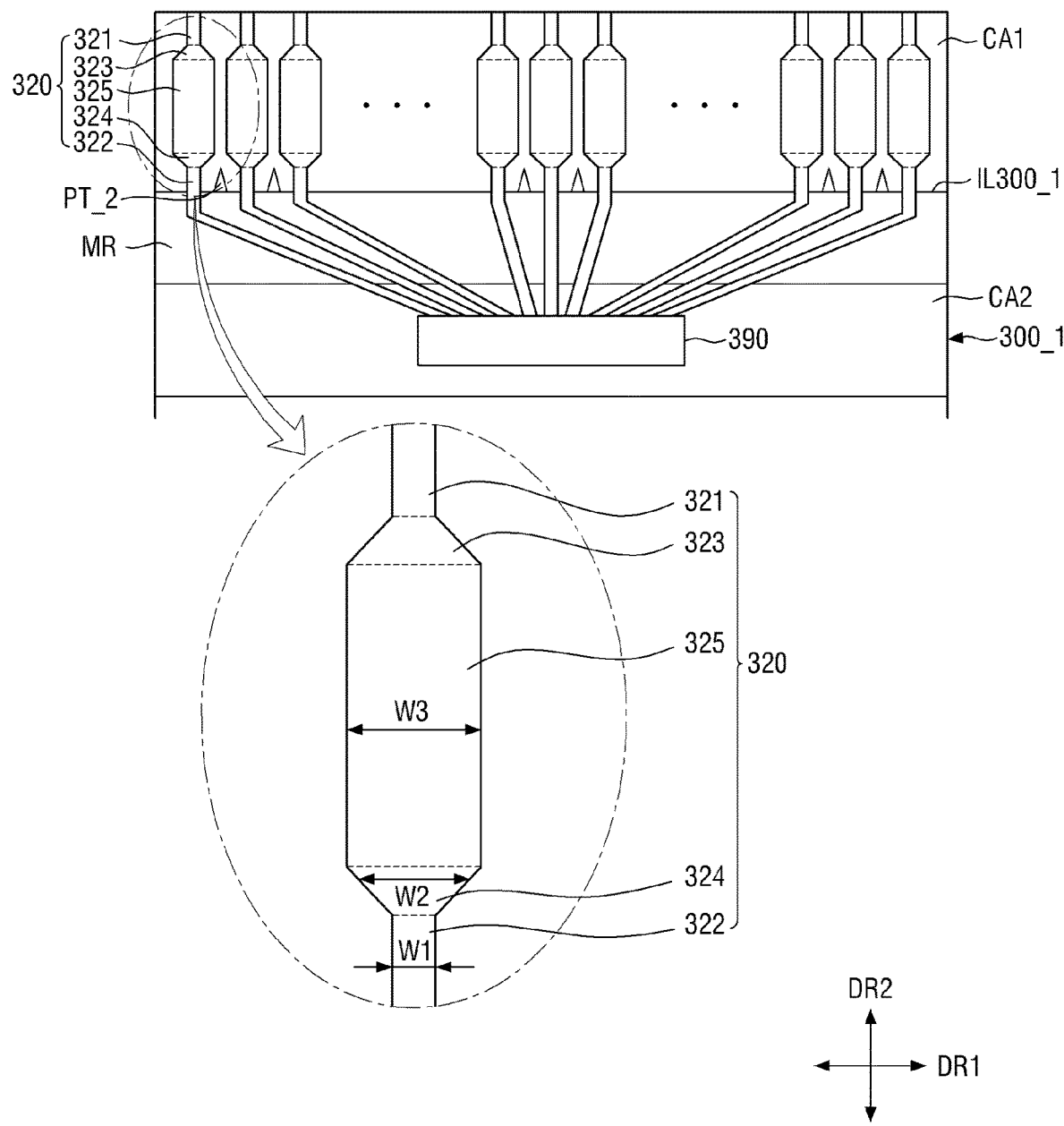
FIG. 21 is a partial layout view illustrating a PCB of a display device according to another embodiment of the present disclosure.

FIG. 21 is a partial layout view illustrating a PCB of a display device according to another embodiment of the present disclosure.

The display device of FIG. 21 differs from the display device of FIG. 13 only in that protrusion patterns PT_2, like the insulating patterns VIA3_2 of FIG. 18, have a triangular shape in a plan view, and thus, a detailed description thereof will be omitted.

Figure 22:
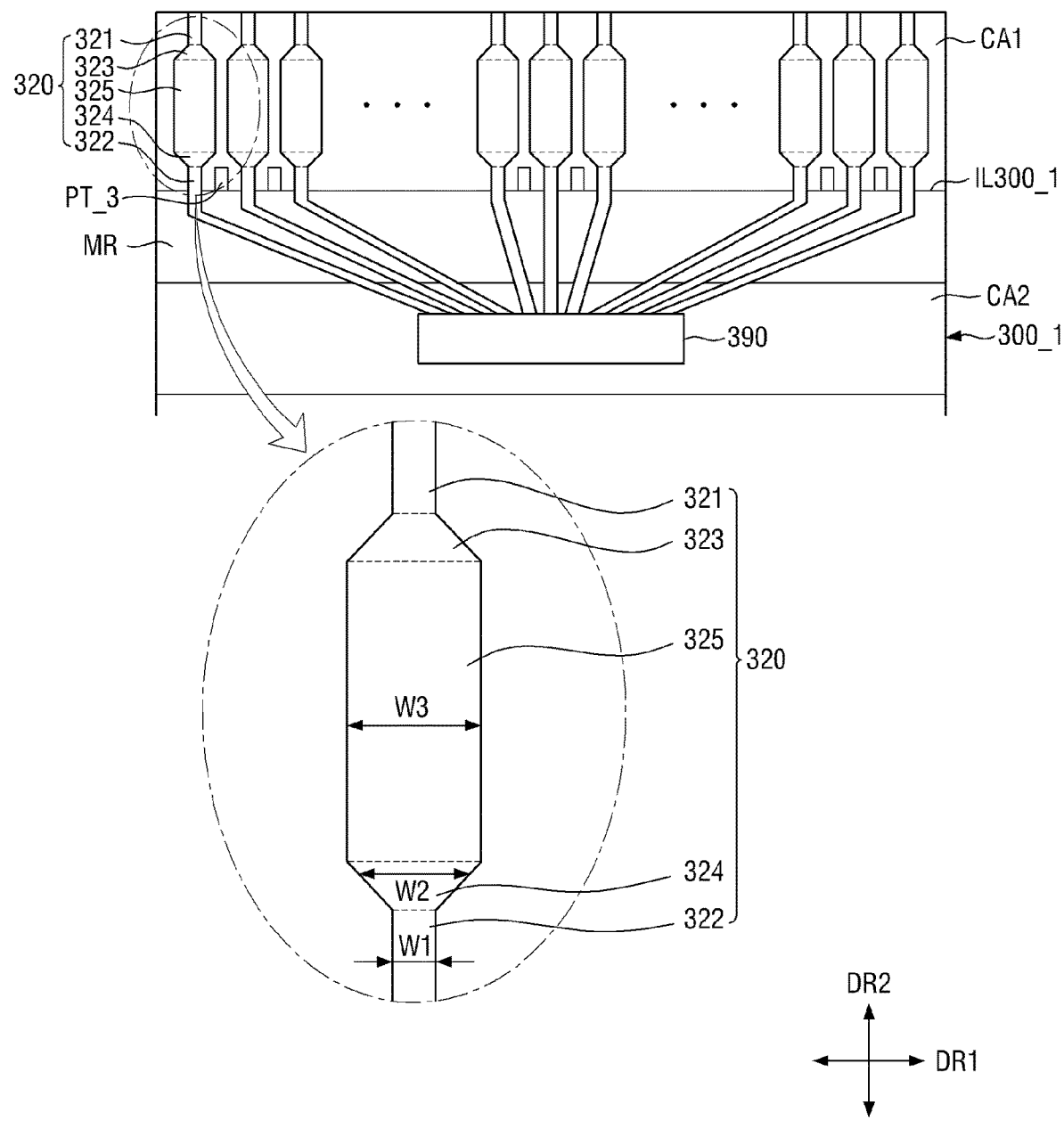
FIG. 22 is a partial layout view illustrating a PCB of a display device according to another embodiment of the present disclosure.

FIG. 22 is a partial layout view illustrating a PCB of a display device according to another embodiment of the present disclosure.

The display device of claim 22 differs from the display device of FIG. 13 only in that protrusion patterns PT_3, like the insulating patterns VIA3_3 of FIG. 19, may have a rectangular shape in a plan view, and thus, a detailed description thereof will be omitted.

Figure 23:
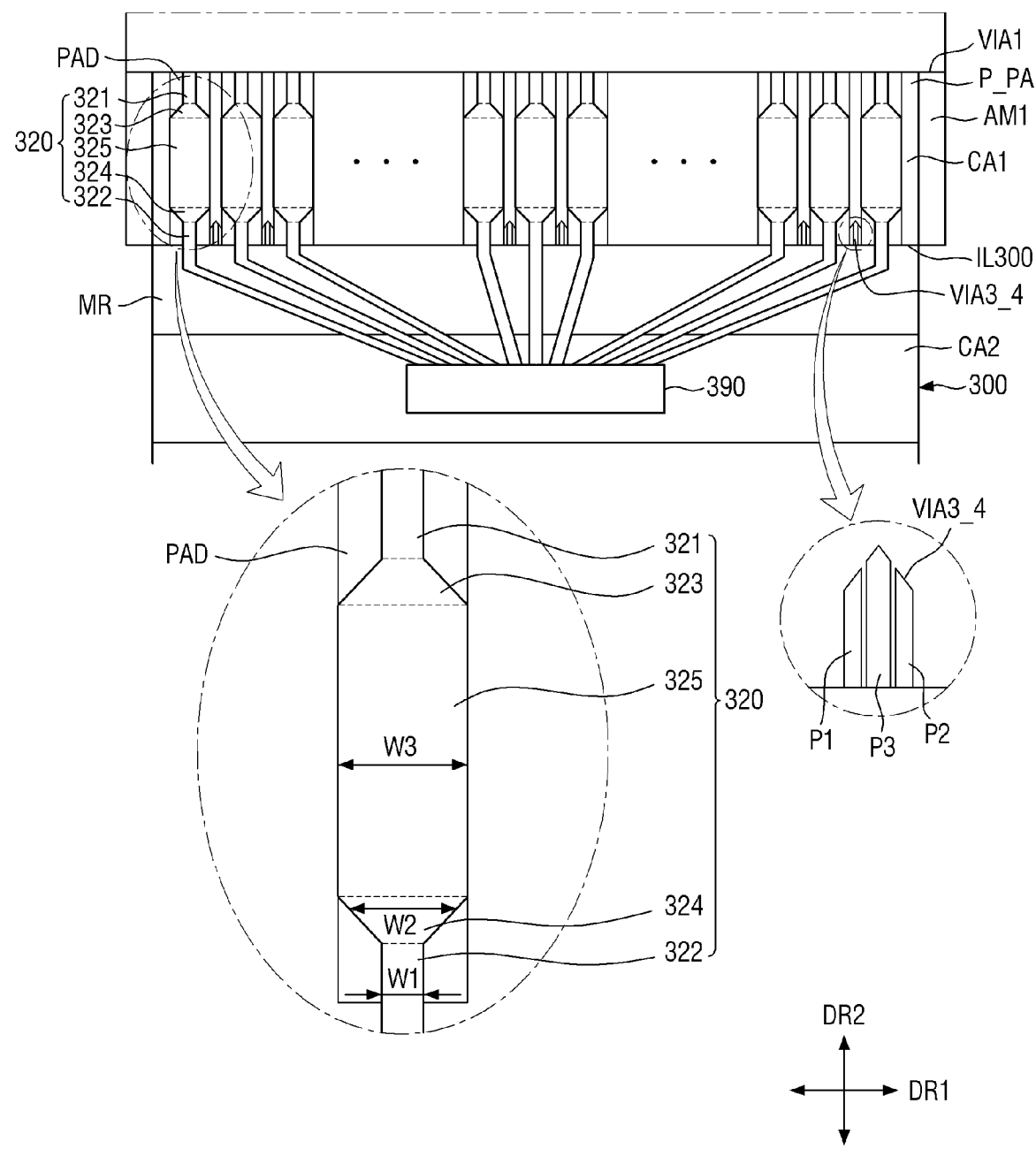
FIG. 23 is a layout view illustrating a pad area and a PCB of a display device according to another embodiment of the present disclosure.

FIG. 23 is a layout view illustrating a pad area and a PCB of a display device according to another embodiment of the present disclosure.

The display device of FIG. 23 differs from the display device of FIG. 1 in that each of insulating patterns VIA3_4 includes a plurality of separate patterns, i.e., first through third patterns P1 through P3.

Specifically, referring to FIG. 23, the first through third patterns P1 through P3 may be disposed to be spaced apart from one another in a first direction DR1. The third pattern P3 may be disposed between the first and second patterns P1 and P2. As described above with reference to FIGS. 10 and 11, a first adhesive member material (not illustrated) may flow between the first, second, and third patterns P1, P2, and P3. Each of the insulating patterns VIA3_4 is illustrated in FIG. 23 as including three separate patterns, but the present disclosure is not limited thereto. Alternatively, each of the insulating patterns VIA3_4 may include two separate patterns or four or more separate patterns.

Figure 24:
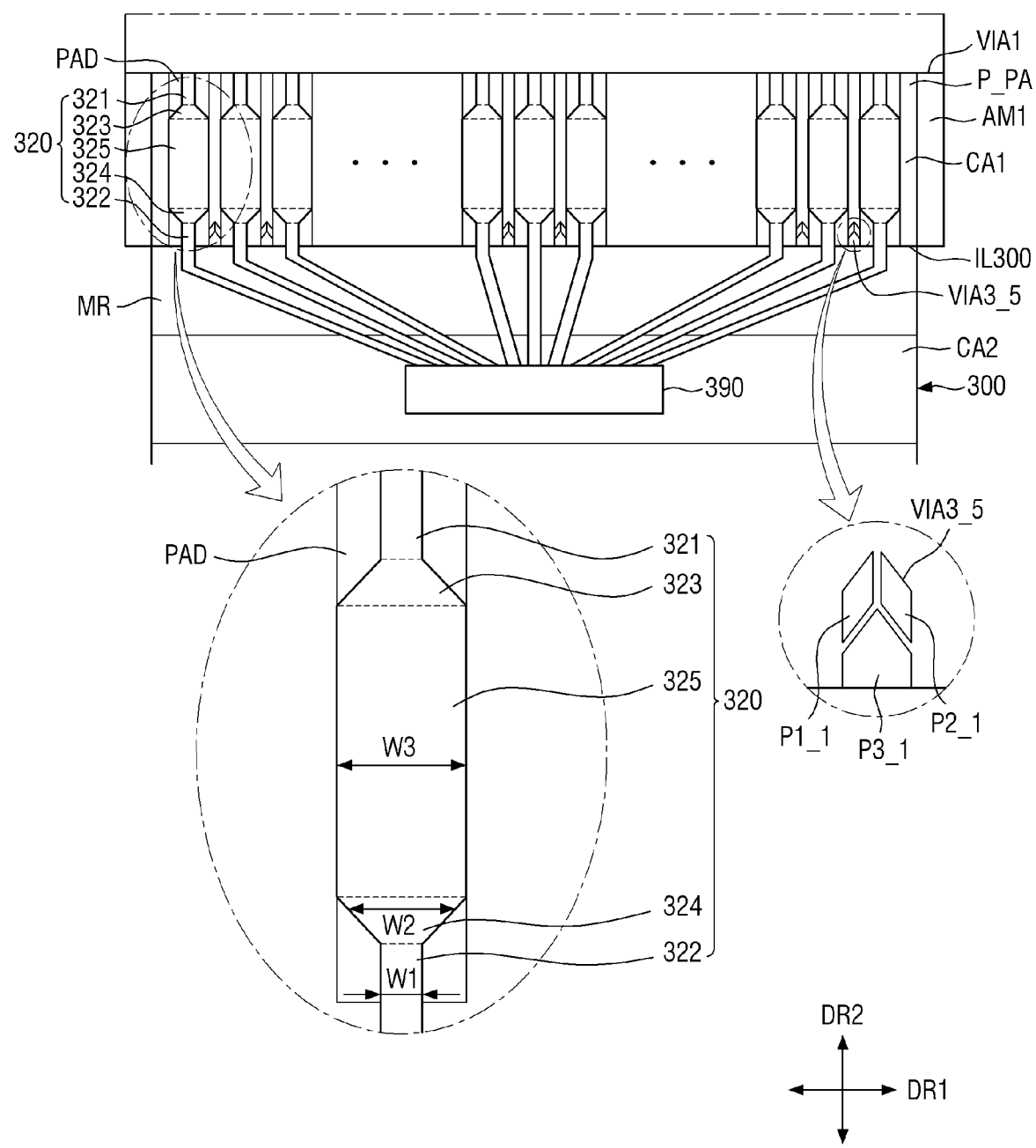
FIG. 24 is a layout view illustrating a pad area and a PCB of a display device according to another embodiment of the present disclosure.

FIG. 24 is a layout view illustrating a pad area and a PCB of a display device according to another embodiment of the present disclosure.

The display device of FIG. 24 differs from the display device of FIG. 23 in that each of insulating patterns VIA3_5 includes a plurality of separate patterns, i.e., first through third patterns P1_1 through P3_1.

Specifically, referring to FIG. 24, the third pattern P3_1 may be disposed below the first and second patterns P1_1 and P2_1 in a second direction DR2. The first and second patterns P1_1 and P2_1 may be spaced apart from each other in a first direction DR1, and the first and the third patterns P1_1 and P3_1 or the second and third patterns P2_1 and P3_1 may be spaced apart from each other in the second direction DR2. A first adhesive member material (not illustrated) may flow in two streams along the spaces between the first and third patterns P1_1 and P3_1 and between the second and third patterns P2_1 and P3_1.

Figure 25:
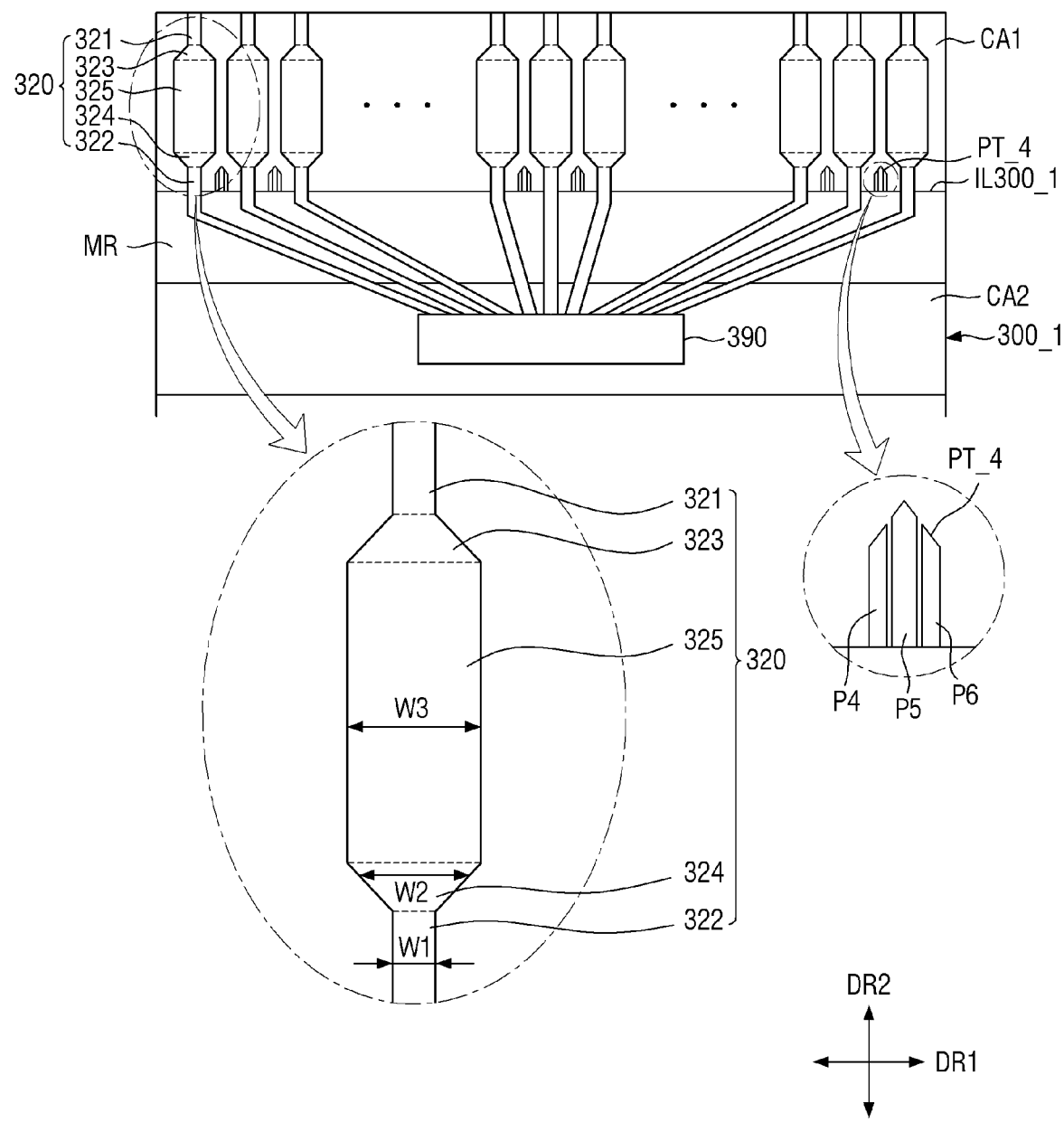
FIG. 25 is a partial layout view illustrating a PCB of a display device according to another embodiment of the present disclosure.

FIG. 25 is a partial layout view illustrating a PCB of a display device according to another embodiment of the present disclosure.

The display device of FIG. 25 differs from the display device of FIG. 13 only in that each of protrusion patterns PT_4 includes a plurality of separate patterns, i.e., fourth through sixth patterns P4 through P6, and thus, a detailed description thereof will be omitted.

Figure 26:
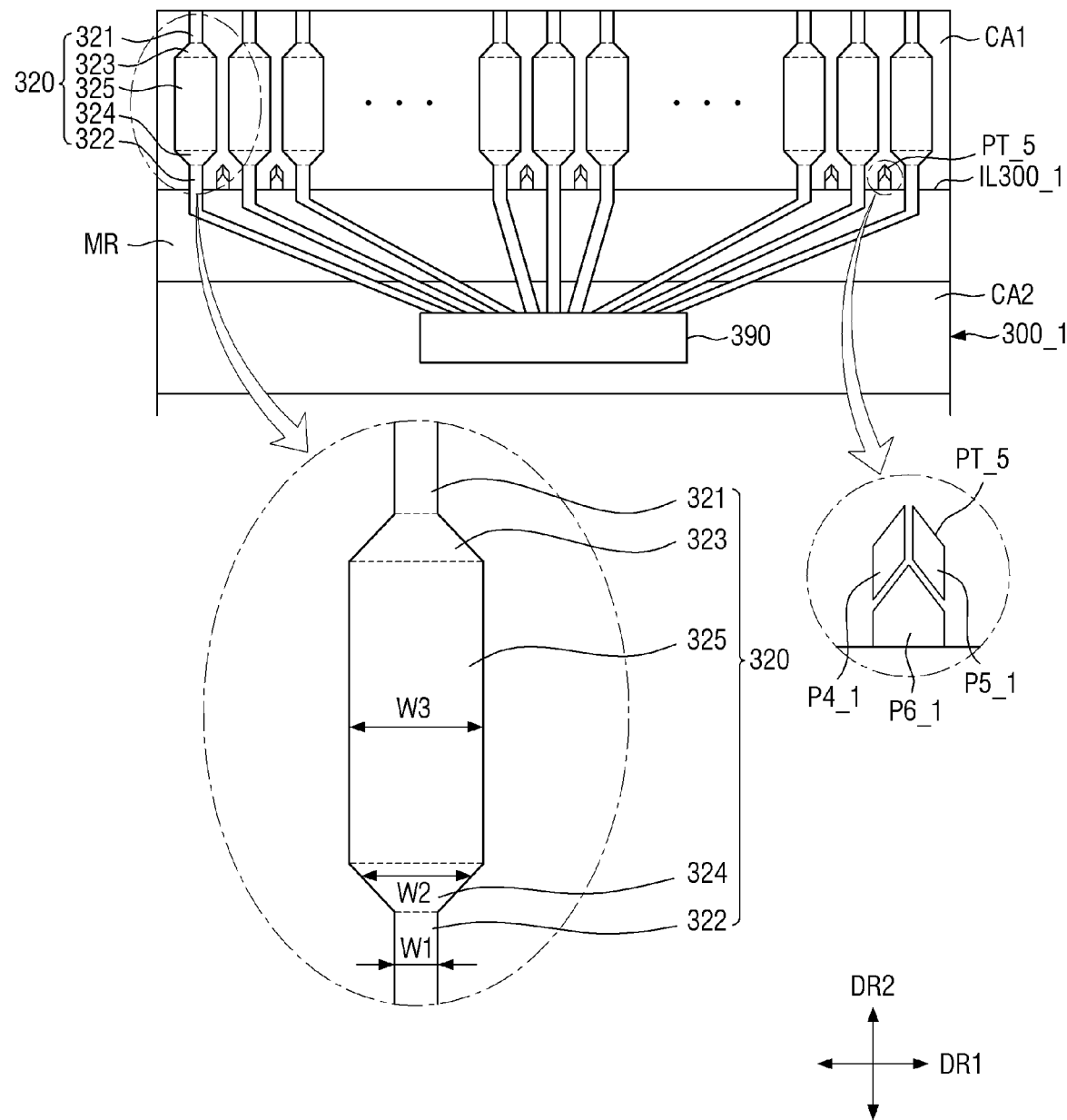
FIG. 26 is a partial layout view illustrating a PCB of a display device according to another embodiment of the present disclosure.

FIG. 26 is a partial layout view illustrating a PCB of a display device according to another embodiment of the present disclosure.

The display device of FIG. 26 differs from the display device of FIG. 25 only in that each of protrusion patterns PT_5 includes a plurality of separate patterns, i.e., fourth through sixth patterns P4_1 through P6_1, and thus, a detailed description thereof will be omitted.

Although certain embodiments and implementations have been described herein, other embodiments and modifications will be apparent from this description. Accordingly, the inventive concept of the present disclosure is not limited to such embodiments, but rather to the broader scope of the claims presented herein and various obvious modifications and equivalent arrangements.

What is claimed is:

1. A display device, comprising:
a base substrate having a display area and a non-display area including a pad area;
a plurality of signal wires disposed on the base substrate extending in a first direction from an end portion of the base substrate and spaced apart from one another in a second direction which intersects the first direction, said signal wires having upper surfaces;
a pattern disposed among the plurality of signal wires on an outermost portion of the base substrate without overlapping the upper surfaces of the signal wires;
a printed circuit board attached on the pad area and comprising a driving integrated circuit, and a plurality of lead wires connected to the driving integrated circuit and spaced apart from one another in the second direction,
wherein each of the plurality of lead wires includes:
a first lead portion which has a first width,
a second lead portion which has a second width that is narrower than the first width and is disposed between the first lead portion and the driving integrated circuit, and
a third lead portion which is disposed between the first lead portion and the second lead portion, wherein the third lead portion has a third width that gradually increases from the second lead portion to the first lead portion.

2. The display device of claim 1, further comprising:
an insulating layer exposing the plurality of signal wires in the pad area,
wherein the pattern is disposed in a same layer as the insulating layer.

3. The display device of claim 2,
wherein the plurality of lead wires overlap with the plurality of signal wires.

4. The display device of claim 3, further comprising:
an anisotropic conductive film disposed between the plurality of signal wires and the plurality of lead wires,
wherein the plurality of signal wires and the plurality of lead wires are electrically coupled by the anisotropic conductive film.

5. The display device of claim 4, wherein the printed circuit board has a pattern disposed between the plurality of lead wires.

6. The display device of claim 1, wherein the pattern is disposed between the second lead portions.

7. The display device of claim 6, wherein a distance between the first lead portions is smaller than a distance between the second lead portions.

8. The display device of claim 7, wherein the distance between the first lead portions is 0.8 to 1.2 times the sum of the distance between the second lead portion and its adjacent pattern and a distance between the adjacent pattern and its adjacent second lead portion.

9. The display device of claim 8, wherein the anisotropic conductive film is in contact with sides of each of the first lead portions, sides of each of the second lead portions, and sides of pattern.

10. The display device of claim 1, wherein the pattern is also disposed between the third lead portions.

11. The display device of claim 10, wherein
the distance between the first lead portions is smaller than a distance between the third lead portions, and
the distance between the first lead portions is the same as the sum of the distance between the third lead portions and the distance between the patterns.

12. The display device of claim 11, wherein the anisotropic conductive film is further in contact with sides of each of the third lead portions and the sides of each of the patterns.

13. The display device of claim 1, wherein the signal wires comprises side surfaces extending in a direction that intersects the upper surfaces, and the pattern contacts the side surfaces.

* * * * *